United States Patent
Honda

(10) Patent No.: US 7,623,407 B2
(45) Date of Patent: Nov. 24, 2009

(54) SEMICONDUCTOR DEVICE

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 11/839,859

(22) Filed: Aug. 16, 2007

(65) Prior Publication Data
US 2008/0089165 A1 Apr. 17, 2008

(30) Foreign Application Priority Data
Aug. 17, 2006 (JP) ............... 2006-222640

(51) Int. Cl.
G11C 8/00 (2006.01)
(52) U.S. Cl. ............... 365/233.1; 365/233.12; 365/230.08
(58) Field of Classification Search ............ 365/233.1, 365/233.12, 230.08
See application file for complete search history.

(56) References Cited

U.S. PATENT DOCUMENTS 5,901,109 A * 5/1999 Miura .................. 365/233.1
6,507,180 B2 1/2003 Eguchi
6,850,459 B2 2/2005 Suzuki
2005/0088245 A1 4/2005 Isobe

FOREIGN PATENT DOCUMENTS

JP 2002-149252 5/2002
JP 2005-78510 3/2005

* cited by examiner

Primary Examiner—Son Dinh
Assistant Examiner—Nam Nguyen
(74) Attorney, Agent, or Firm—Oblon, Spivak, McClelland, Maier & Neustadt, P.C.

(57) ABSTRACT

A semiconductor device which continuously outputs data in synchronism with a first clock includes a clock generator which generates a second clock from the first clock which is externally supplied, a flip-flop circuit which operates in synchronism with the second clock, and receives the data, an output buffer circuit which outputs the output data from the flip-flop circuit outside, and a power supply circuit which includes a bandgap reference circuit, generates a voltage controlled by the bandgap reference circuit, and supplies the voltage as a power supply voltage to the clock generator, the flip-flop circuit, and the output buffer circuit.

20 Claims, 17 Drawing Sheets

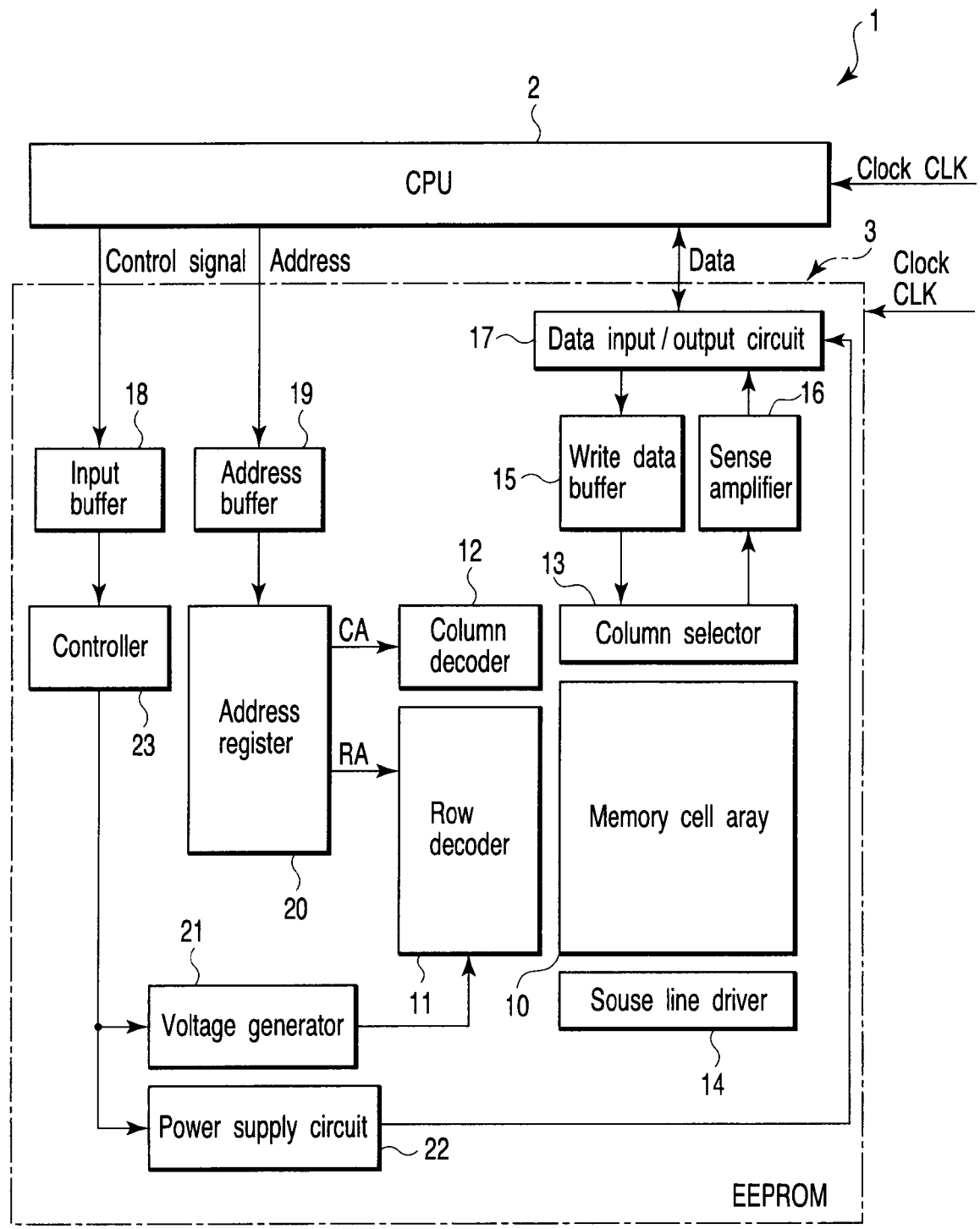
F I G. 1

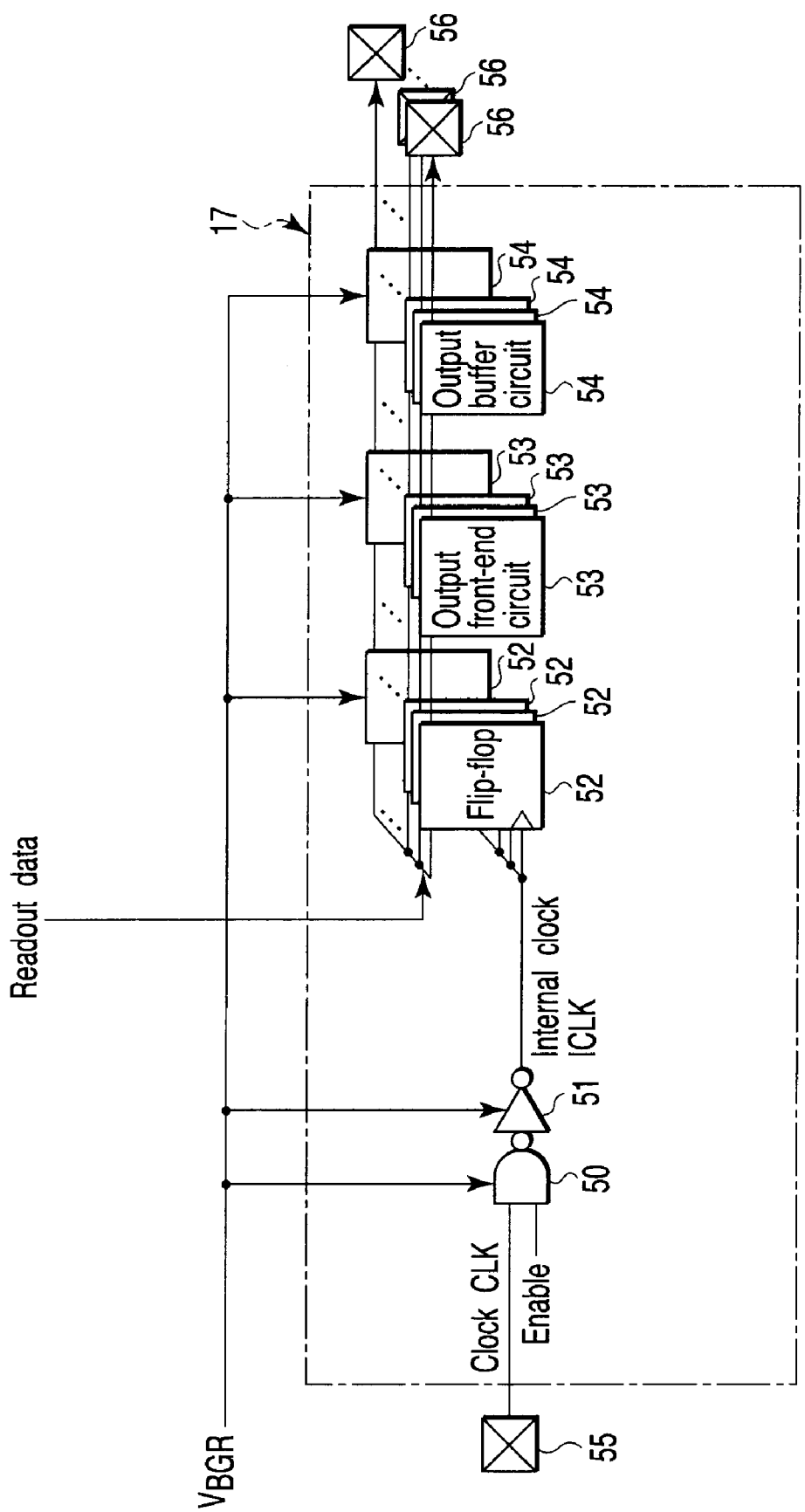
F I G. 6

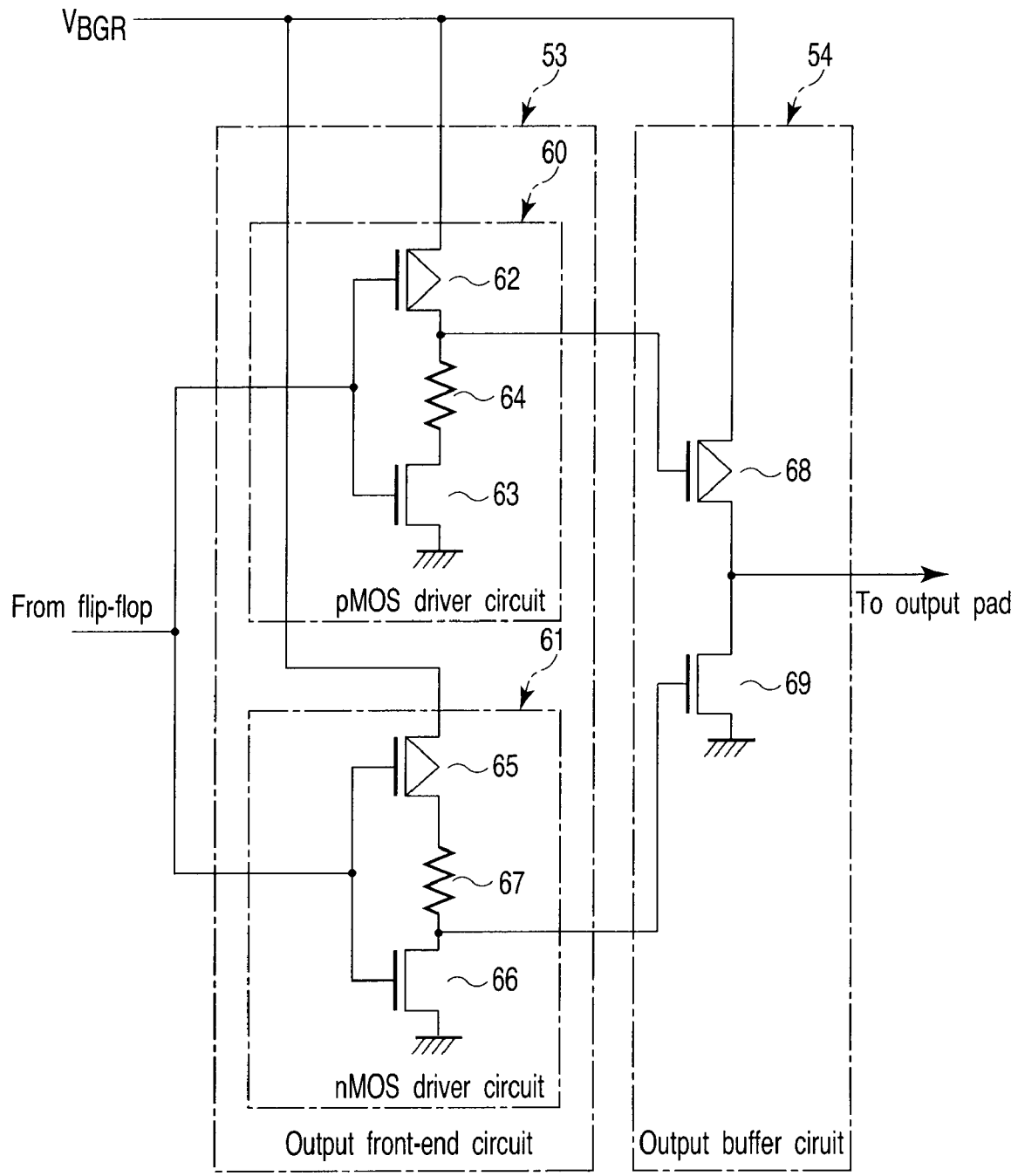
F I G. 7

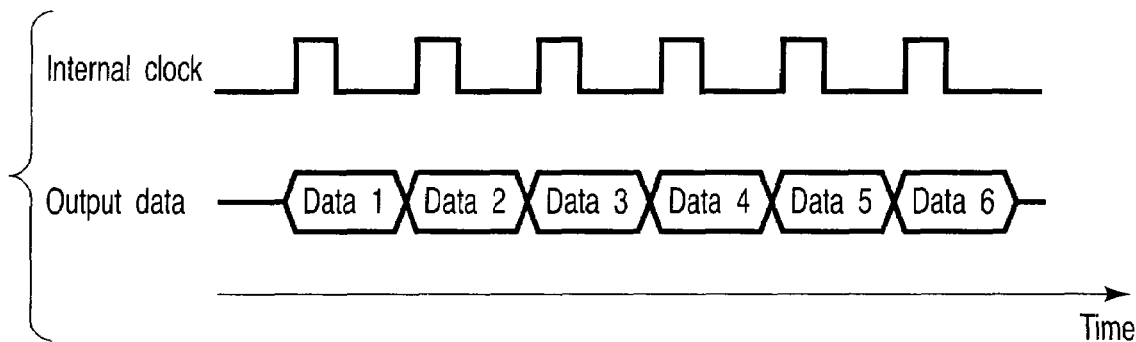
F I G. 8
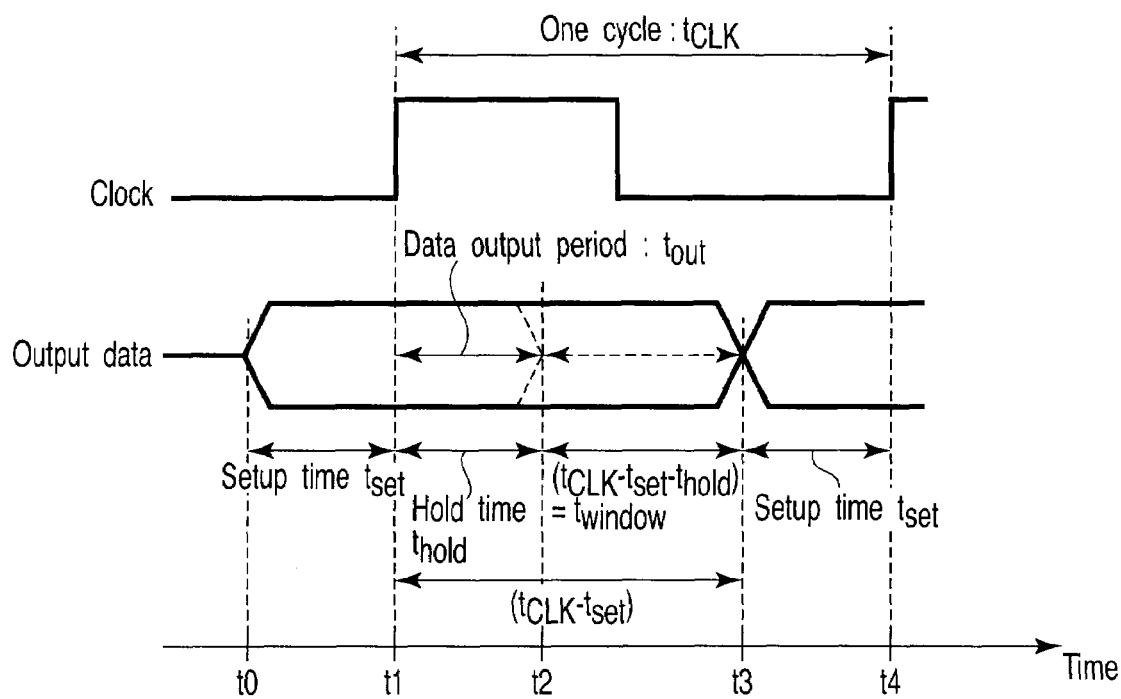
F I G. 9

| Waiting clock count | Decoder circuit |
|---|---|
| 9 or more | CNT1 |
| 5 ~ 8 | CNT2 |
| 4 or less | CNT3 |

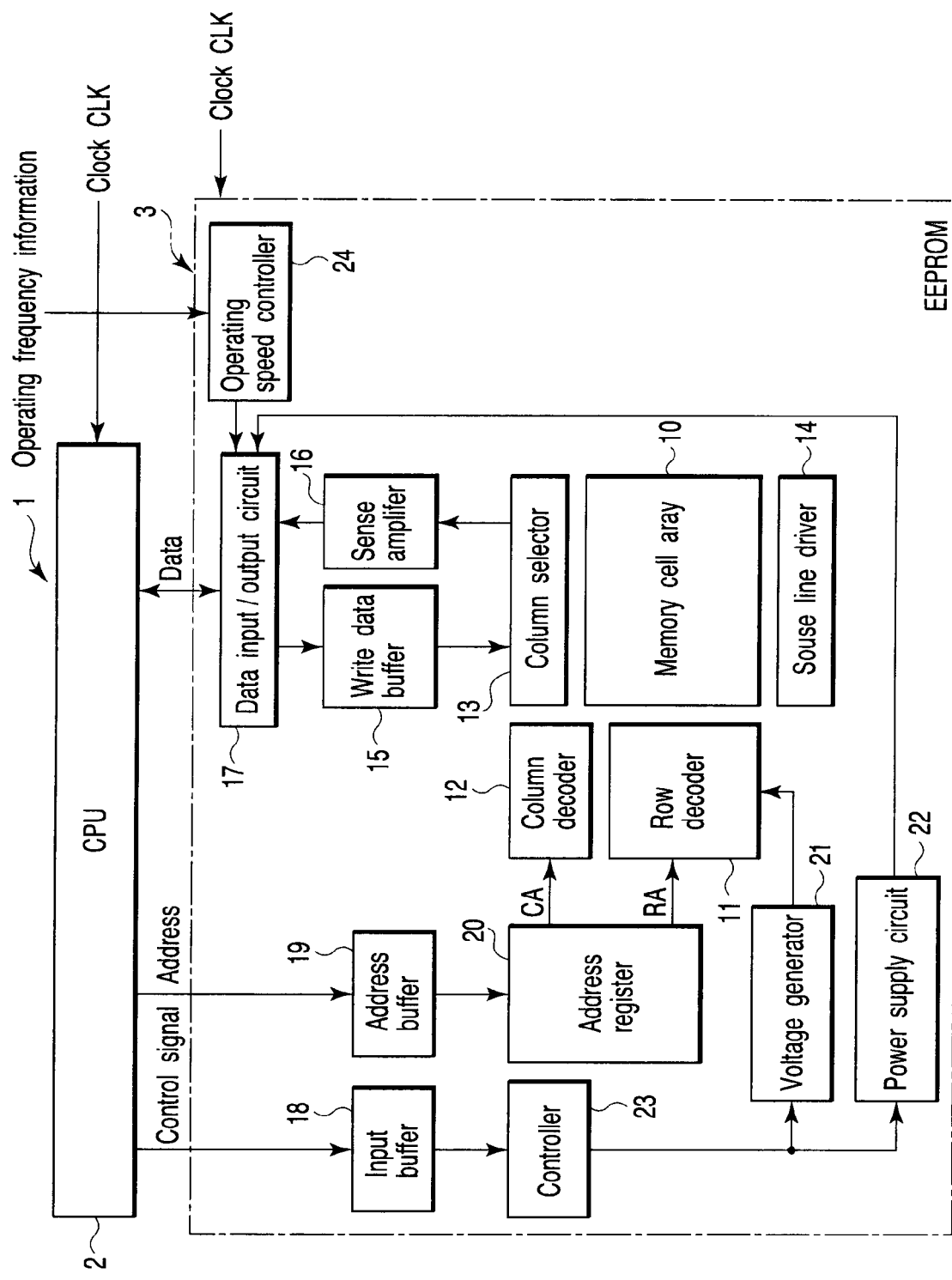
F I G. 21

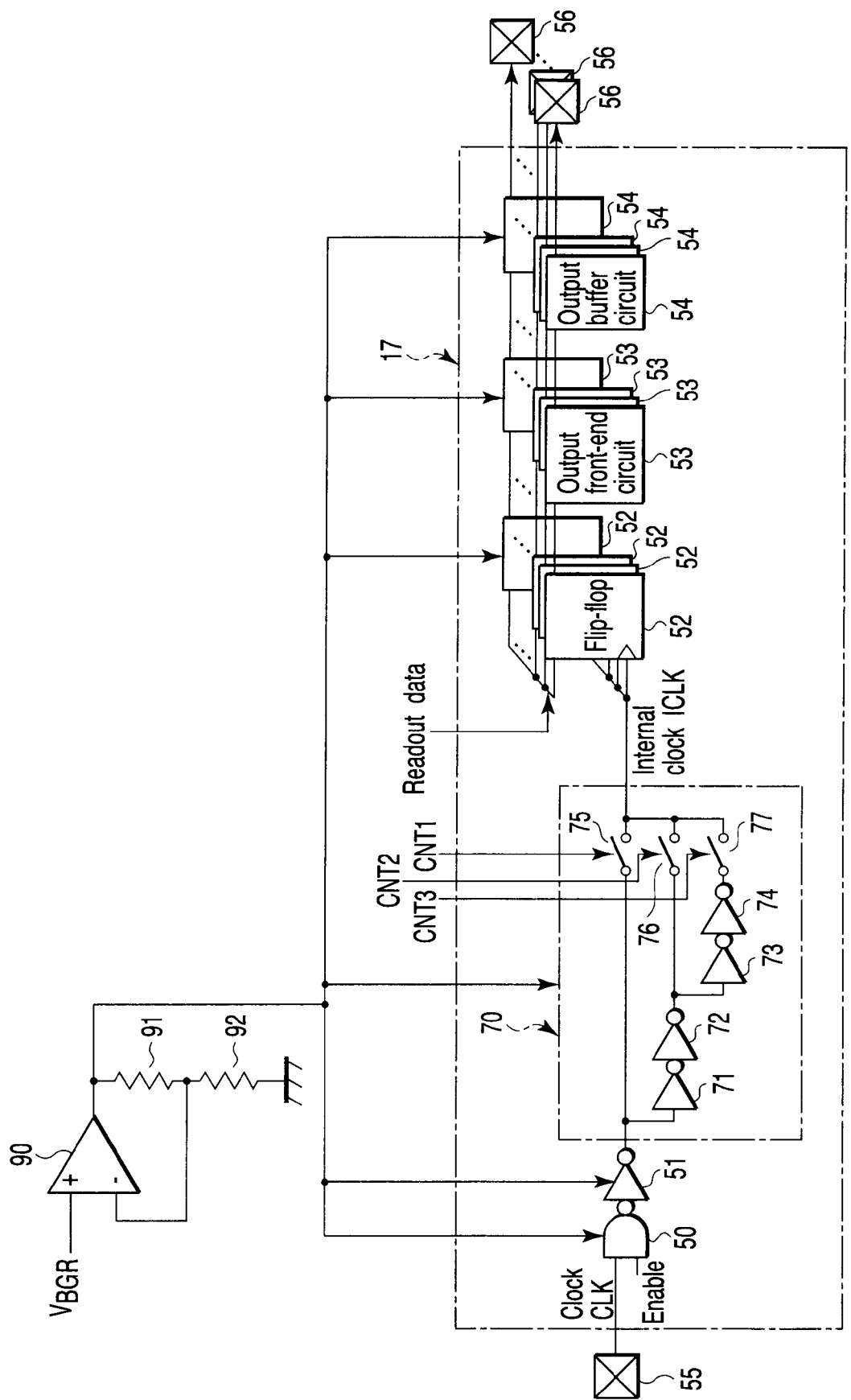
F I G. 25

SEMICONDUCTOR DEVICE

CROSS-REFERENCE TO RELATED APPLICATIONS

This application is based upon and claims the benefit of priority from prior Japanese Patent Application No. 2006-222640, filed Aug. 17, 2006, the entire contents of which are incorporated herein by reference.

BACKGROUND OF THE INVENTION

1. Field of the Invention

The present invention relates to a semiconductor device. For example, the present invention relates to a semiconductor memory that continuously reads out data in synchronism with a clock.

2. Description of the Related Art

Recently, even a nonvolatile semiconductor memory is required to perform high-speed data read (to be, referred to as burst access hereinafter) in synchronism with an externally supplied clock. Also, the frequency of a clock by which a nonvolatile semiconductor memory operates is rising. Accordingly, the data output rate of a nonvolatile semiconductor memory is inevitably increasing.

At the timing of the edge of a certain clock, a CPU fetches data output from a semiconductor memory in synchronism with the edge of a clock immediately preceding the certain clock. In this case, the data must be input to the CPU a predetermined period before the edge of the certain clock. This will be called "setup" hereinafter, and the period of setup will be called "setup time" hereinafter. Also, the data must be kept input to the CPU for a predetermined period from the edge of the certain clock. This will be called "hold" hereinafter, and the period of hold will be called "hold time" hereinafter. Accordingly, each data output period must be equal to or longer than the hold time, and equal to or smaller than the difference between the period of one cycle of the clock and the setup time (e.g., Jpn. Pat. Appln. KOKAI Publication Nos. 2005-078510 and 2002-149252).

As the operating frequency rises, however, the condition of the data output period becomes strict. For example, when the operating frequency is 108 MHz, the data output period is 2 (inclusive) to 7 (inclusive) ns, so the allowable range is only 5 ns. In addition, a semiconductor element changes its characteristics in accordance with the voltage or temperature. This makes it very difficult to match the data output period with defined conditions while taking account of the voltage and temperature.

Also, the condition of the data output period fluctuates in accordance with the operating frequency. Accordingly, if a semiconductor memory is designed to match a CPU that operates at a high frequency, this semiconductor memory may not match a CPU that operates at a low frequency. That is, the versatility of the semiconductor memory deteriorates.

BRIEF SUMMARY OF THE INVENTION

A semiconductor device according to the first aspect of the present invention which continuously outputs data in synchronism with a clock, comprises a clock generator which generates a second clock from the first clock which is externally supplied, a flip-flop circuit which operates in synchronism with the second clock, and receives the data, an output buffer circuit which outputs the output data from the flip-flop circuit outside, and a power supply circuit which includes a bandgap reference circuit, generates a voltage controlled by the bandgap reference circuit, and supplies the voltage as a power supply voltage to the clock generator, the flip-flop circuit, and the output buffer circuit.

A semiconductor device according to the second aspect of the present invention which continuously outputs data in synchronism with a clock, comprises a clock generator including a delay circuit which delays the clock, a flip-flop circuit which operates in synchronism with the clock delayed by the delay circuit, and receives the data, and an output buffer circuit which outputs the output data from the flip-flop circuit outside, wherein a delay time of the delay circuit changes inversely proportional to a frequency of the clock.

BRIEF DESCRIPTION OF THE SEVERAL VIEWS OF THE DRAWING

FIG. 1 is a block diagram of a system LSI according to the first embodiment of the present invention;

FIG. 6 is a circuit diagram of a data input/output circuit of the EEPROM according to the first embodiment of the present invention;

FIG. 7 is a circuit diagram of an output front-end circuit and output buffer circuit of the EEPROM according to the first embodiment of the present invention;

FIG. 8 is a timing chart of the internal clock and output data of the EEPROM according to the first embodiment of the present invention;

FIG. 9 is a timing chart of the clock and data of a system LSI;

FIG. 21 is a block diagram of a system LSI according to the fourth embodiment of the present invention;

FIG. 25 is a circuit diagram of a power supply circuit and data input/output circuit of an EEPROM according to a modification of the fourth embodiment of the present invention.

DETAILED DESCRIPTION OF THE INVENTION

Figure 2:
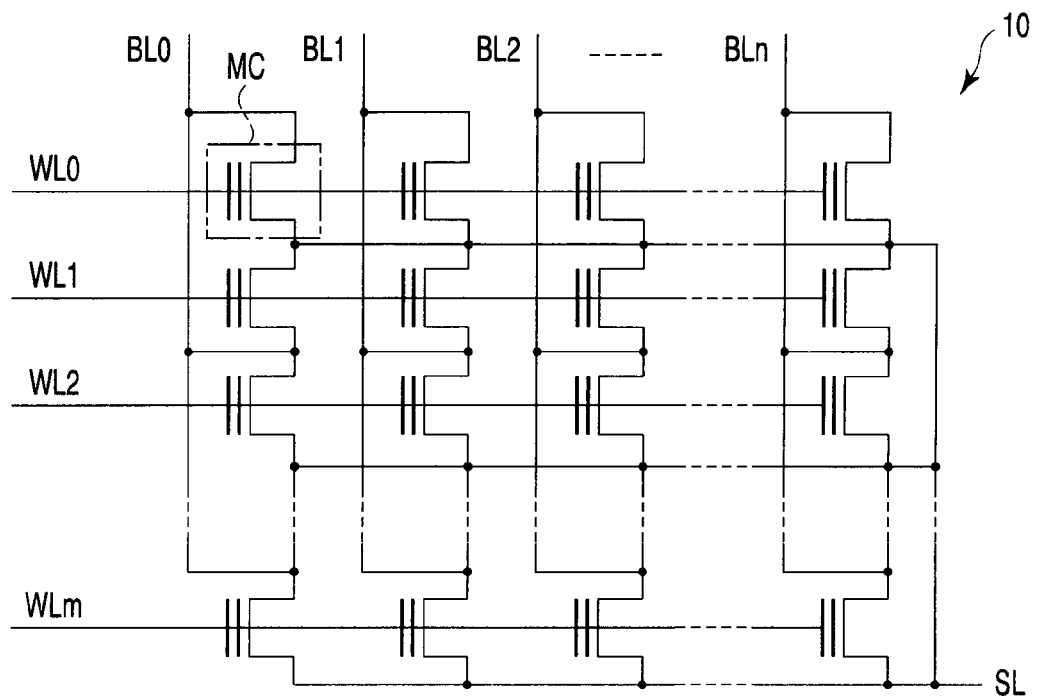
FIG. 2 is a circuit diagram of a memory cell array of an EEPROM according to the first embodiment of the present invention.

Embodiments of the present invention will be explained below with reference to the accompanying drawing. In the following explanation, the same reference numerals denote the same parts throughout the drawing.

FIRST EMBODIMENT

A semiconductor device according to the first embodiment of the present invention will be explained below. FIG. 1 is a block diagram of a system LSI according to this embodiment.

As shown in FIG. 1, a system LSI 1 comprises a CPU 2 and semiconductor memory (EEPROM) 3. A data bus (not shown) connects the CPU 2 and EEPROM 3 so that they can exchange data with each other.

The EEPROM 3 is, e.g., a NOR flash memory, and holds programs and data required for the CPU 2 to operate. The CPU 2 performs various arithmetic operations by using the data and the like held in the EEPROM 3. The CPU 2 and EEPROM 3 receive an external clock CLK. The CPU 2 operates in synchronism with the clock CLK, and the EEPROM 3 outputs data in synchronism with the clock CLK.

The arrangement of the EEPROM 3 will be explained in detail below. As shown in FIG. 1, the EEPROM 3 comprises a memory cell array 10, row decoder 11, column decoder 12, column selector 13, source line driver 14, write data buffer 15, sense amplifier 16, data input/output circuit 17, input buffer 18, address buffer 19, address register 20, voltage generator 21, power supply circuit 22, and controller 23.

The memory cell array 10 comprises NOR flash memory cells arranged in a matrix. Each memory cell is connected to a bit line, word line, and source line. The row decoder 11 performs selection in the row direction of the memory cell array 10, i.e., selects a word line. The column decoder 12 performs selection in the column direction of the memory cell array 10. The column selector 13 selects a bit line on the basis of the selecting operation of the column decoder 12, and connects the bit line to the write data buffer 15 or sense amplifier 16. The source line driver 14 applies a voltage to the source line. The sense amplifier 16 senses and amplifies data read out from a memory cell selected by the row decoder 11 and column decoder 12. The write data buffer 15 holds data to be written in memory cells, and writes the data in the memory cells such that data is written in every predetermined number of memory cells at once.

The input buffer 18 receives a control signal from the CPU 2, and outputs the signal to the controller 23. Examples of the control signal are a chip enable signal, write enable signal, and output enable signal. The chip enable signal makes the EEPROM 3 operable. The write enable signal makes it possible to write data in the EEPROM 3. The output enable signal enables the EEPROM 3 to output data. The address buffer 19 receives an address from the CPU 2, and outputs the address to the address register 20.

The data input/output circuit 17 receives write data from the CPU 2, and transfers the data to the write data buffer 15. Also, the data input/output circuit 17 continuously outputs data amplified by the sense amplifier 16 to the CPU 2 in synchronism with the clock.

In accordance with an address supplied from the address buffer 19, the address register 20 outputs a column address CA to the column decoder 12 and a row address RA to the row decoder 11. The column decoder 12 and row decoder 11 respectively select a bit line and word line on the basis of the column address CA and row address RA.

The voltage generator 21 generates a voltage in accordance with the external voltage. The voltage generated by the voltage generator 21 is applied to, e.g., the row decoder 11, memory cell array 10, write data buffer 15, and sense amplifier 16.

The power supply circuit 22 is a bandgap reference circuit. The power supply circuit 22 will be called a bandgap reference circuit 22 hereinafter. The bandgap reference circuit 22 generates a voltage $V_{BGR}$ and supplies it to the data input/output circuit 17. The data input/output circuit 17 operates by using, as a power supply voltage, not the voltage generated by the voltage generator 21 but the voltage $V_{BGR}$ generated by the bandgap reference circuit 22.

The controller 36 controls the operations of the above circuits.

The arrangement of the memory cell array 10 will be explained below with reference to FIG. 2. FIG. 2 is a circuit diagram showing the arrangement of the memory cell array. As shown in FIG. 2, the memory cell array 10 comprises ((m+1)×(n+1)) (m and n are natural numbers) memory cells MC. The memory cell MC is a MOS transistor having a stacked gate including a charge storage layer (e.g., a floating gate) and control gate. The control gates of the memory cells MC on the same row are connected together to one of word lines WL0 to WLm. The drains of the memory cells MC in the same column are connected together to one of bit lines BL0 to BLn. Furthermore, the sources of the memory cells MC are connected together to a source line SL.

Figure 3:
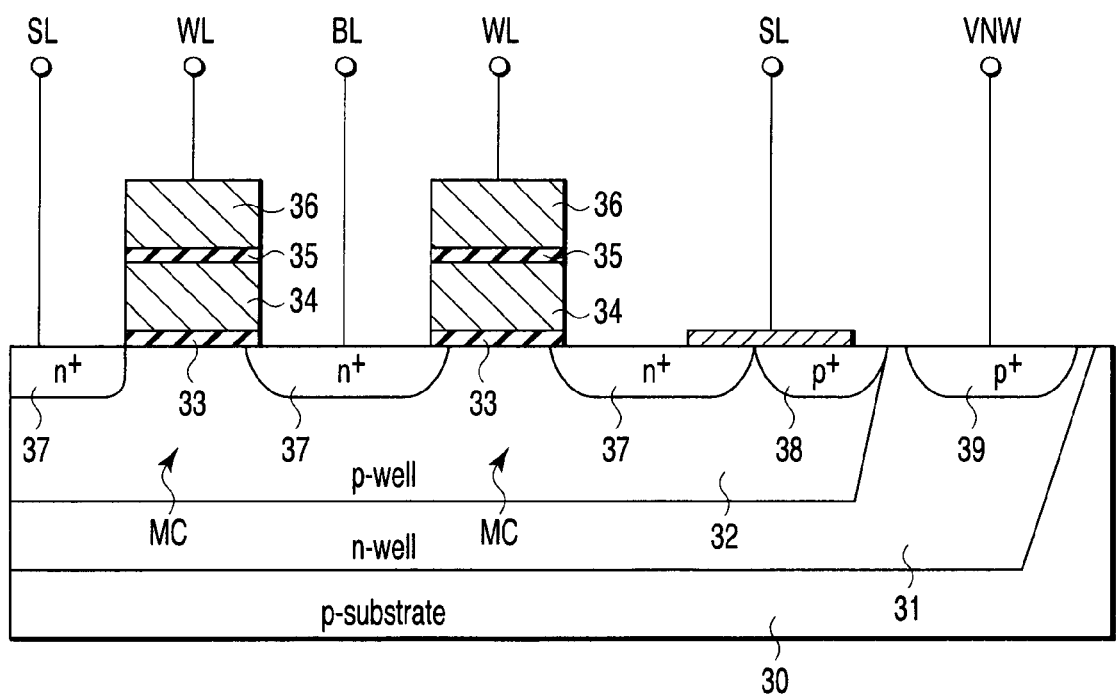
FIG. 3 is a sectional view of the memory cell array of the EEPROM according to the first embodiment of the present invention.

The sectional structure of the memory cell MC will be explained below with reference to FIG. 3. FIG. 3 is a sectional view of a partial region of the memory cell array 10. As shown in FIG. 3, an n-type well region 31 is formed in the surface region of a p-type semiconductor substrate 30, and a p-type well region 32 is formed in the surface region of the n-type well region 31. Gate insulating films 33 are formed on the p-type well region 32, and the gate electrodes of the memory cells MC are formed on the gate insulating films 33. The gate electrode of the memory cell MC has a polysilicon layer 34 formed on the gate insulating film 33, and a polysilicon layer 36 formed on an inter-gate insulating film 35 on the polysilicon layer 34. The inter-gate insulating film 35 is, e.g., a silicon oxide film or an ON film, NO film, or ONO film having a stacked structure of a silicon oxide film and silicon nitride film. The polysilicon layers 34 function as floating gates (FG), and are separated between the memory cells MC. On the other hand, the polysilicon layers 36 adjacent to each other in a direction perpendicular to the bit lines are connected together to function as a control gate (word line WL). N+-type impurity diffusion layers 37 are formed in the surface of the p-type well region 32 between adjacent gate electrodes. Each impurity diffusion layer 37 is shared by adjacent transistors, and functions as a source region or drain region. The source region and drain region of the memory cell MC are respectively connected to the source line SL and bit line BL. In addition, a p+-type impurity diffusion layer 38 is formed in the surface region of the p-type well region 32, and an n+-type impurity diffusion layer 39 is formed in the surface region of the n-type well region 31. The same potential as the source line SL is applied to the p-type well region 32 through the impurity diffusion layer 38, and a well voltage VNW is applied to the n-type well region 31 through the impurity diffusion layer 39.

Figure 4:
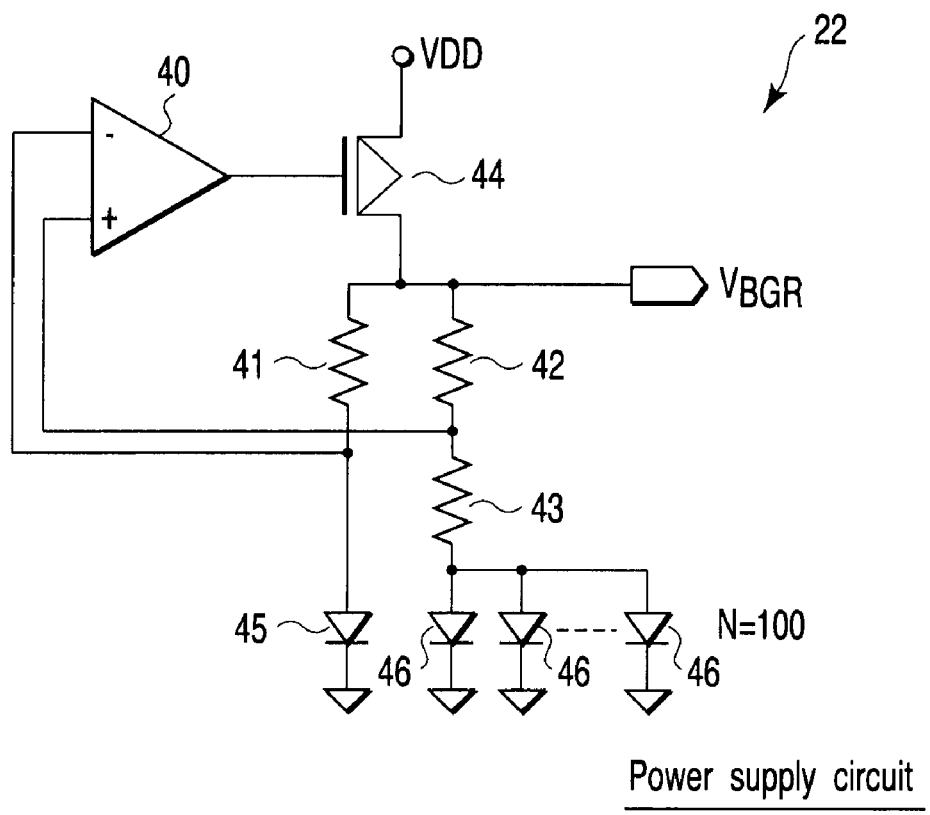
FIG. 4 is a circuit diagram of a bandgap reference circuit of the EEPROM according to the first embodiment of the present invention.

The arrangement of the bandgap reference circuit 22 will be explained below with reference to FIG. 4. FIG. 4 is a circuit diagram of the bandgap reference circuit 22. As shown in FIG. 4, the bandgap reference circuit 22 comprises an operational amplifier 40, resistance elements 41 to 43, a p-channel MOS transistor 44, a diode 45, and N diodes 46. The number of the diodes 46 is, e.g., 100 (N=100).

The MOS transistor 44 has a gate connected to the output terminal of the operational amplifier 40, and a source that receives a power supply voltage VDD. The resistance element 41 has one terminal connected to the drain of the MOS transistor 44, and the other terminal connected to the anode of the diode 45. The cathode of the diode 45 is grounded. The resistance element 42 has one terminal connected to the drain of the MOS transistor 44, and the other terminal connected to one terminal of the resistance element 43. The other terminal of the resistance element 43 is connected to the anodes of the N diodes 46. The cathodes of the diodes 46 are grounded. The connection node between the other terminal of the resistance element 41 and the anode of the diode 45 is connected to the inverting input terminal (−) of the operational amplifier 40. The connection node between the other terminal of the resistance element 42 and one terminal of the resistance element 43 is connected to the positive input terminal (+) of the operational amplifier 40. The voltage at the connection node between the drain of the MOS transistor 44 and one terminal of each of the resistance elements 41 and 42 is output as the output voltage $V_{BGR}$ of the bandgap reference circuit 22.

Figure 5:
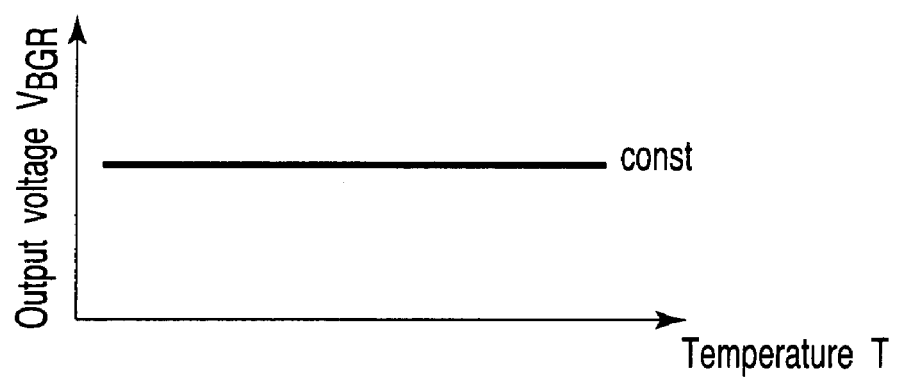
FIG. 5 is a graph showing the dependence that the output voltage of the bandgap reference circuit of the EEPROM according to the first embodiment of the present invention has on the temperature.

Letting R1 to R3 be the resistance values of the resistance elements 41 to 43 and Vf1 be the voltage drop of the diode 45, the output voltage $V_{BGR}$ of the bandgap reference circuit 22 is represented by $$V_{BGR}=Vf1+(R2/R3)\times VT\times \ln(N\cdot R2/R1) \quad (1)$$

where VT is the temperature voltage and VT=kT/q, k is a Boltzmann's constant, T is the absolute temperature, and q is the charge amount of an electron. The temperature characteristic of the voltage $V_{BGR}$ is represented by $$dV_{BGR}/dT=dVf1/dT+(R2/R3)\times(k/q)\times \ln(N\cdot R2/R1) \quad (2)$$

that differentiates equation (1) by the temperature. In equation (2), the first term is a variable determined by the characteristics of the semiconductor elements included in the bandgap reference circuit 22, and the second term is a variable determined by the resistance ratio of the resistance elements 41 to 43. In the bandgap reference circuit 22, the resistance ratio of the second term is set such that the second term cancels the change in voltage $V_{BGR}$ with temperature indicated by the first term. Accordingly, the voltage $V_{BGR}$ has a constant value regardless of the temperature. FIG. 5 is a graph showing the temperature characteristic of the bandgap reference circuit 22, in which the abscissa indicates a temperature T, and the ordinates indicates the output voltage $V_{BGR}$. As shown in FIG. 5, the voltage $V_{BGR}$ is constant regardless of the temperature T.

The arrangement of the data input/output circuit 17 will be explained below with reference to FIG. 6. FIG. 6 is a circuit diagram of the data input/output circuit 17. As shown in FIG. 6, the data input/output circuit 17 comprises a NAND gate 50, an inverter 51, flip-flops 52, output front-end circuits 53, and output buffer circuits 54.

The NAND gate 50 NANDs the clock CLK externally input to a clock input pad 55 of the EEPROM 3 and an enable signal. The enable signal indicates whether the EEPROM 3 is in a standby state. If the enable signal is at "H" level, the EEPROM 3 is in the standby state and inoperable. If the enable signal is at "L" level, the EEPROM 3 is released from the standby state and operable. The inverter 51 inverts the NAND operation result from the NAND gate 50, and outputs the inversion result as an internal clock ICLK. That is, the NAND gate 50 and inverter 51 function as an internal clock ICLK generator.

The flip-flops 52 operate in response to the internal clock ICLK supplied from the inverter 51. The flip-flops 52 store data read out from the sense amplifier 16 in synchronism with the internal clock ICLK, and output the readout data in synchronism with the next internal clock ICLK. The flip-flops 52 are made up of, e.g., a plurality of transistors.

The output front-end circuits 53 control the output buffer circuits 54 in accordance with the data supplied from the flip-flops 52. The output buffer circuits 54 output data under the control of the output front-end circuits 53. The output data from the output buffer circuits 54 is output from the data output pad of the EEPROM 3 to the CPU 2.

The data input/output circuit 17 with the above arrangement functions by using the voltage $V_{BGR}$ output from the bandgap reference circuit 22 as a power supply voltage. That is, the constant voltage $V_{BGR}$ independent of the temperature is supplied as a power supply voltage to the internal clock ICLK generator including the NAND gate 50 and inverter 51, the flip-flops 52, the output front-end circuits 53, and the output buffer circuits 54.

The arrangements of the output front-end circuit 53 and output buffer circuit 54 will be explained below with reference to FIG. 7. FIG. 7 is a circuit diagram of the output front-end circuit 53 and output buffer circuit 54. First, the arrangement of the output front-end circuit 53 will be explained.

As shown in FIG. 7, the output front-end circuit 53 comprises a PMOS driver circuit 60 and nMOS driver circuit 61. The PMOS driver circuit 60 comprises a p-channel MOS transistor 62, n-channel MOS transistor 63, and resistance element 64. The MOS transistor 62 has a source that receives the voltage $V_{BGR}$, a drain connected to one terminal of the resistance element 64, and a gate that receives data from the flip-flop 52. The MOS transistor 63 has a source that is grounded, a drain connected to the other terminal of the resistance element 64, and a gate that receives data from the flip-flop 52. The connection node between the drain of the MOS transistor 62 and one terminal of the resistance element 64 is the output node of the pMOS driver circuit 60.

The nMOS driver circuit 61 comprises a p-channel MOS transistor 65, n-channel MOS transistor 66, and resistance element 67. The MOS transistor 65 has a source that receives the voltage $V_{BGR}$, a drain connected to one terminal of the resistance element 67, and a gate that receives data from the flip-flop 52. The MOS transistor 66 has a source that is grounded, a drain connected to the other terminal of the resistance element 67, and a gate that receives data from the flip-flop 52. The connection node between the drain of the MOS transistor 66 and the other terminal of the resistance element 67 is the output node of the nMOS driver circuit 61.

The output buffer circuit 54 will be explained next. As shown in FIG. 7, the output buffer circuit 54 comprises a p-channel MOS transistor 68 and n-channel MOS transistor 69. The MOS transistor 68 has a source that receives the voltage $V_{BGR}$, a drain connected to the drain of the MOS transistor 69, and a gate connected to the output node of the pMOS driver circuit 60. The MOS transistor 69 has a source that is grounded, and a gate that is connected to the output node of the nMOS driver circuit 61. The connection node between the drain of the MOS transistor 68 and the drain of the MOS transistor 69 is the output node of the output buffer circuit 54, and connected to the output pad.

The output front-end circuit 53 functions as a driving circuit of the output buffer circuit 54. That is, the pMOS driver circuit 60 and nMOS driver circuit 61 included in the output front-end circuit 53 respectively drive the MOS transistors 68 and 69 included in the output buffer circuit 54. Note that the resistance elements 64 and 67 make the driving timings of the MOS transistors 68 and 69 different so that these transistors are not simultaneously turned on.

The EEPROM 3 having the above arrangement performs burst access as described previously. FIG. 8 shows this burst access. FIG. 8 is a timing chart of the clock CLK at the time of data read, and the output data (readout data) from the EEPROM 3. As shown in FIG. 8, the data is continuously output in synchronism with the clock. When the start address of data to be read out is input to the EEPROM 3, the address buffer 19, for example, of the EEPROM 3 increments the address to generate consecutive addresses from the start address. The data is read out from the memory cells MC corresponding to the generated addresses. The readout data is amplified by the sense amplifier 16 and input to the data input/output circuit 17. In the data input/output circuit 17, the flip-flops 52 receive the data in synchronism with the internal clock, and output the data to the output front-end circuits 53 in synchronism with the internal clock. Accordingly, the output front-end circuits 53 drive the output buffer circuits 54 in synchronism with the internal clock. Consequently, the output buffer circuits 54 output the data outside in synchronism with the internal clock.

For example, assume that the sense amplifier 16 inputs data "1" to the flip-flop 52 at the edge of a certain clock. In this case, the flip-flop 52 outputs the data "1" to the output front-end circuit 53 at the edge of the next clock. Since the data "1" is input, the n-channel MOS transistors 63 and 66 are turned on in the output front-end circuit 53. Therefore, the pMOS driver circuit 60 and nMOS driver circuit 61 output "L" level. Consequently, the p-channel MOS transistor 68 is driven in the output buffer circuit 54, so the output buffer circuit 54 outputs "H" level, i.e., data "1".

When the sense amplifier 16 outputs data "0", the n-channel MOS transistor 69 is driven in the output buffer circuit 54, so the output buffer circuit 54 outputs data "0".

As described above, the EEPROM according to the first embodiment of the present invention achieves effect (1) below.

(1) Design of the data output timings can be simplified (No. 1).

In the EEPROM according to this embodiment, the power supply voltage of the data input/output circuit 17 that outputs data is not a voltage externally applied to the EEPROM 3, but the voltage $V_{BGR}$ applied from the bandgap reference circuit 22. Accordingly, design of the data output timings of the EEPROM 3 can be simplified. This effect will be explained below.

FIG. 9 is a timing chart of the clock and data output from the EEPROM 3 to the CPU 2. For example, assume that the CPU 2 fetches data at the rising edge of the clock. As described in "BACKGROUND OF THE INVENTION", therefore, the data must be output to the CPU 2 at time t0 before time t1 that is the rising edge of the clock, in order to perform "setup". This setup time will be called $t_{set}$ hereinafter. Also, the data must be kept output during at least a period from time t1 to time t2, in order to perform "hold". This hold time will be called $t_{hold}$ hereinafter. Letting $t_{CLK}$ be the length of one cycle of the clock, as shown in FIG. 9, a data output period tout during which the data is kept output since the rising edge (time t1) of the clock must be equal to or longer than the hold time $t_{hold}$ and equal to or shorter than $(t_{CLK}-t_{set})$. In other words, the end time of the data output period tout must exist in a period from time t2 at which the hold time ends to time t3 at which the setup time for the next data begins. That is, the end time of the data output period tout must be set within $(t_{CLK}-t_{set}-t_{hold})=t_{window}$. The period $t_{window}$ shortens as the clock frequency rises. In addition, the data output rate fluctuates in accordance with the external voltage. This makes it difficult to set the end time of the data output period tout within the period $t_{window}$ that is becoming very short in recent years.

Figure 10:
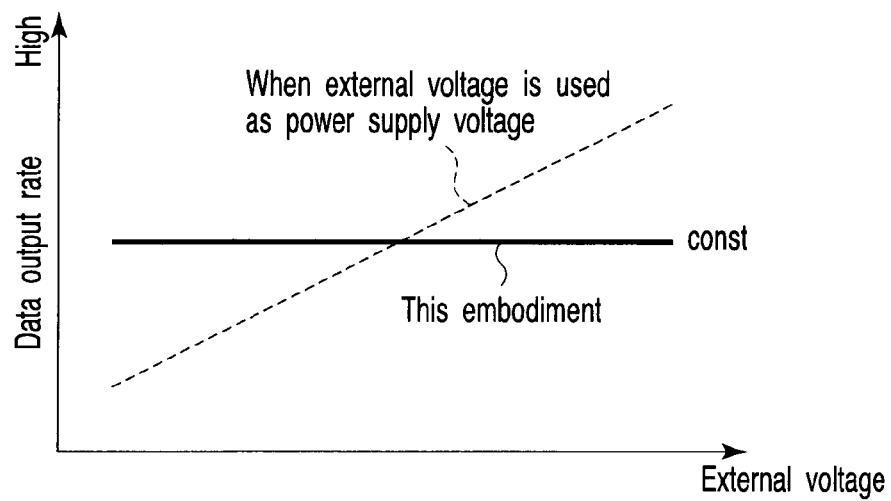
FIG. 10 is a graph showing the dependence that the data output rate of the EEPROM according to the first embodiment of the present invention has on the external voltage.

FIG. 10 shows this problem. FIG. 10 shows the dependence of the data output rate of the EEPROM on the external voltage, in which the abscissa indicates the external voltage, and the ordinate indicates the data output rate. Referring to FIG. 10, the broken line indicates the case that the external voltage drives the data input/output circuit 17, and the solid line indicates this embodiment.

As shown in FIG. 10, when the external voltage drives the data input/output circuit 17, the data output rate increases as the external voltage rises. That is, the data output rate fluctuates in accordance with the fluctuation in external voltage. Therefore, even when the end time of the data output period tout is set within $t_{window}$ at a certain value of the external voltage, the end time may fall outside $t_{window}$ if the external voltage fluctuates.

In the arrangement according to this embodiment, however, not the external voltage but the voltage $V_{BGR}$ generated by the bandgap reference circuit 22 drives the data input/output circuit 17. Also, the value of the voltage $V_{BGR}$ is constant regardless of the temperature. As shown in FIG. 10, therefore, the data output rate of the EEPROM 3, i.e., the data output rate of the data input/output circuit 17 is constant regardless of the external voltage. This makes it possible to prevent the fluctuation in data output period tout with external voltage. As a consequence, design of the data output timings can be simplified.

SECOND EMBODIMENT

A semiconductor device according to the second embodiment of the present invention will be explained below. In this embodiment, a temperature characteristic is given to a voltage $V_{BGR}$ output from a bandgap reference circuit 22 in the first embodiment described above. Since the second embodiment is the same as the first embodiment except for this temperature characteristic of the bandgap reference circuit 22, a repetitive explanation except for the temperature characteristic will be omitted.

Figure 11:
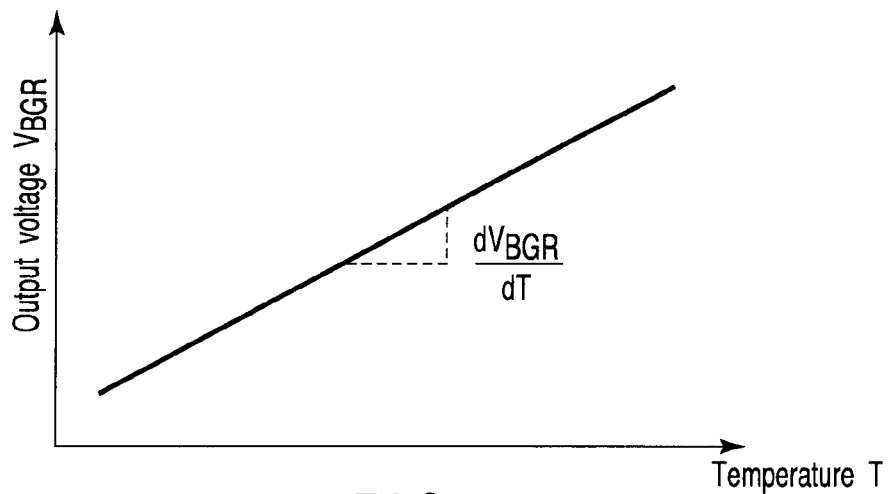
FIG. 11 is a graph showing the dependence that the output voltage of a bandgap reference circuit of an EEPROM according to the second embodiment of the present invention has on the temperature.

FIG. 11 is a graph showing the temperature characteristic of the bandgap reference circuit 22 of an EEPROM 3 according to this embodiment, in which the abscissa indicates the temperature, and the ordinate indicates the voltage $V_{BGR}$. As shown in FIG. 11, the voltage $V_{BGR}$ rises as a temperature T rises. The degree of this rise is $dV_{BGR}/dT$ of equation (2) explained in the first embodiment, and $dV_{BGR}/dT$ is determined as follows.

A semiconductor element changes its characteristics in accordance with not only the external voltage but also the temperature. For example, the data output rate of a data input/output circuit 17 generally decreases as the temperature rises, and increases as the temperature lowers. Also, as explained in the first embodiment, the data output rate increases as the power supply voltage rises, and decreases as the power supply voltage drops. Accordingly, $dV_{BGR}/dT$ has a positive value and is set so as to cancel the dependence of the data output rate on the temperature. Therefore, $dV_{BGR}/dT$ can be set by changing the resistance ratios (R2/R3) and (R2/R1) in equation (2).

As described above, the EEPROM according to the second embodiment of the present invention achieves effect (2) below in addition to effect (1) explained in the first embodiment.

(2) Design of the data output timings can be simplified (No. 2)

Figure 12:
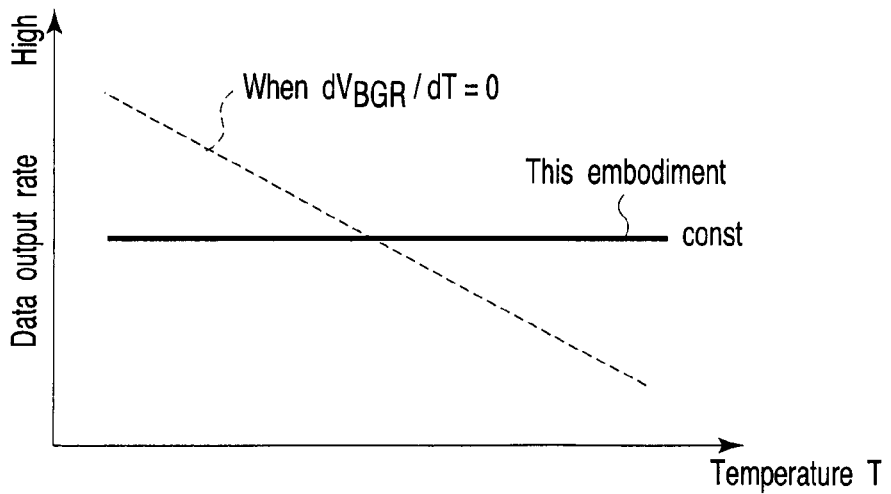
FIG. 12 is a graph showing the dependence that the data output rate of the EEPROM according to the second embodiment of the present invention has on the temperature.

In the arrangement according to this embodiment, the voltage $V_{BGR}$ output from the bandgap reference circuit 22 is given the temperature characteristic opposite to that of the data output rate of the data input/output circuit 17. Accordingly, design of the data output timings can be simplified. This will be explained below with reference to FIG. 12. FIG. 12 shows the dependence of the data output rate of the EEPROM 3 on the external voltage, in which the abscissa indicates the external voltage, and the ordinate indicates the data output rate. Referring to FIG. 12, the broken line indicates the case that $dV_{BGR}/dT=0$, and the solid line indicates this embodiment.

As shown in FIG. 12, when $dV_{BGR}/dT=0$, i.e., when $V_{BGR}$ is constant regardless of the temperature, the dependence of the data output rate upon the external voltage can be suppressed, but the dependence on the temperature remains. Accordingly, the data output rate decreases as a temperature T rises.

In the arrangement according to this embodiment, however, $dV_{BGR}/dT$ is set so as to cancel the temperature characteristic indicated by the broken line. This setting method can be a method that measures the temperature characteristics of individual semiconductor elements and sets $dV_{BGR}/dT$ so as to cancel the measured temperature characteristics, or a method that measures the temperature characteristic of the EEPROM or data input/output circuit 17 as a whole and sets $dV_{BGR}/dT$ so as to cancel the measured temperature characteristic. Consequently, the dependence of the data output rate upon the temperature can be suppressed as shown in FIG. 12. This makes it possible to suppress the dependence of the data output rate on the external voltage and temperature, and simplify design of the data output timings.

THIRD EMBODIMENT

Figure 13:
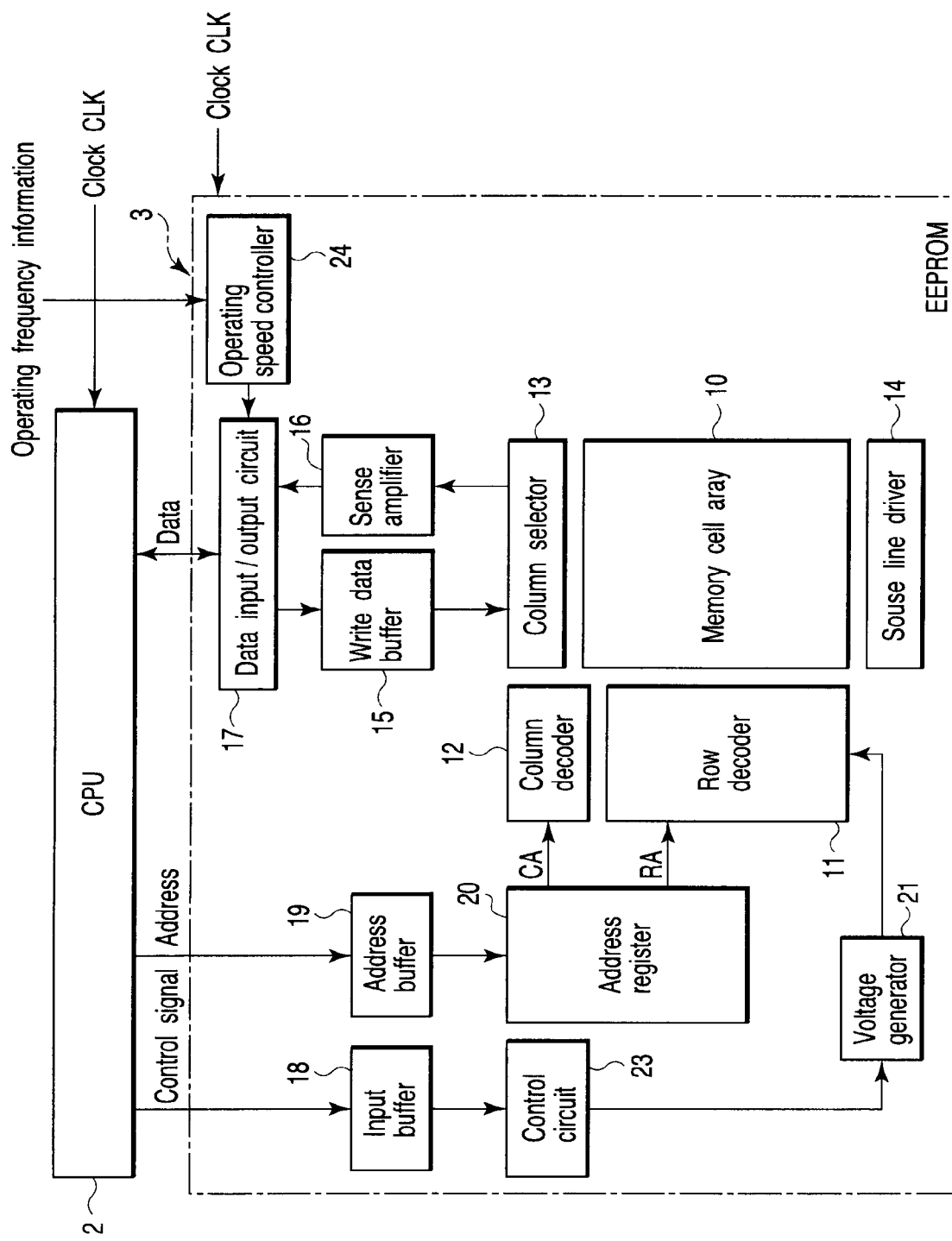
FIG. 13 is a block diagram of a system LSI according to the third embodiment of the present invention.

A semiconductor device according to the third embodiment of the present invention will be explained below. The embodiment is directed to an arrangement that delays an internal clock for determining the data output timings, in accordance with the operating frequency. FIG. 13 is a block diagram of a system LSI 1 according to this embodiment.

As shown in FIG. 13, the LSI 1 according to this embodiment is obtained by omitting a power supply circuit 22, forming an operating speed controller 24, and adding a delay circuit to a data input/output circuit 17 in the first embodiment described above. In this embodiment, the data input/output circuit 17 operates by using, e.g., a voltage generated by a voltage generator 21 as a power supply voltage. The rest of the arrangement is the same as the first embodiment, so a repetitive explanation will be omitted.

Figure 14:
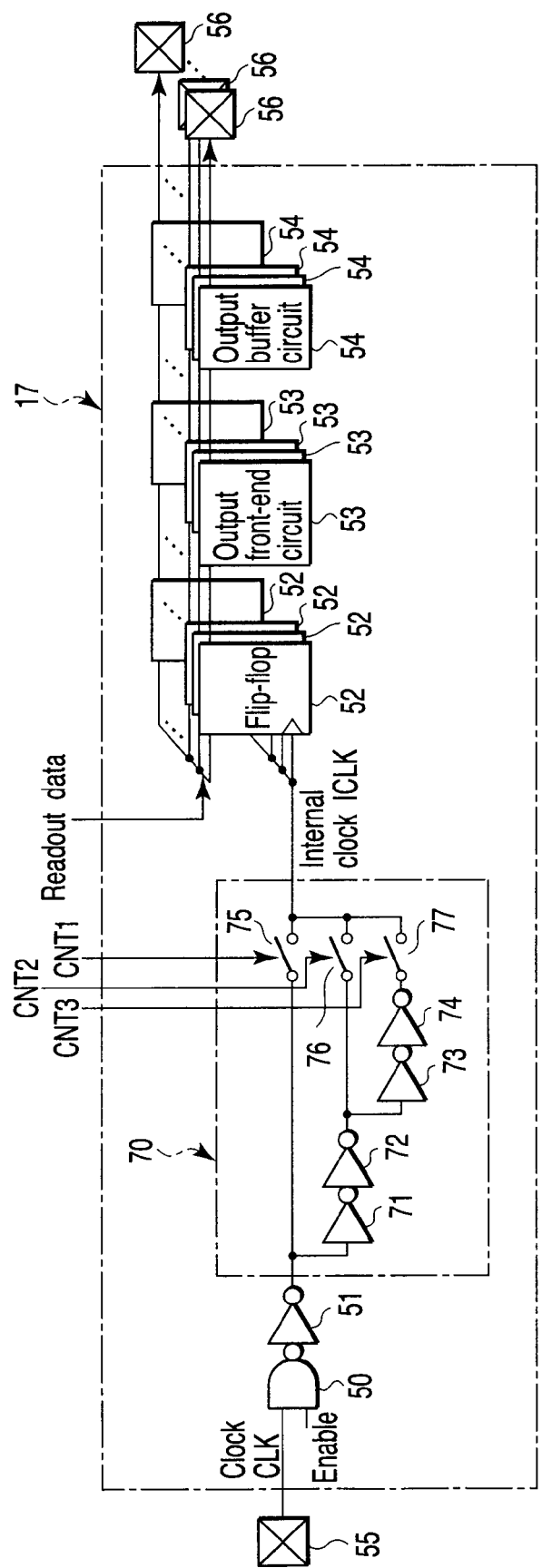
FIG. 14 is a circuit diagram of a data input/output circuit of an EEPROM according to the third embodiment of the present invention.

The arrangement of the data input/output circuit 17 will be explained below with reference to FIG. 14. FIG. 14 is a circuit diagram of the data input/output circuit 17. As shown in FIG. 14, the data input/output circuit 17 further comprises a delay circuit 70 in the arrangement shown in FIG. 6 explained in the first embodiment. The delay circuit 70 comprises inverters 71 to 74 and switching elements 75 to 77.

The inverters 71 and 72 are connected in series, and the input terminal of the inverter 71 is connected to the output terminal of an inverter 51. The inverters 73 and 74 are connected in series, and the input terminal of the inverter 73 is connected to the output terminal of the inverter 72. The switching element 75 supplies the output from the inverter 51 as an internal clock ICLK to flip-flops 52. The switching element 76 supplies the output from the inverter 72 as the internal clock ICLK to the flip-flops 52. The switching element 77 supplies the output from the inverter 74 as the internal clock ICLK to the flip-flops 52. Control signals CNT1 to CNT3 supplied by the operating speed controller 24 respectively control the switching elements 75 to 77 to turn on only one of them.

In the above arrangement, the inverters 71 and 72 and inverters 73 and 74 delay the output from the inverter 51. When the switching element 75 is ON, therefore, the output from the inverter 51 is the internal clock ICLK. That is, the internal clock ICLK has almost no delay from an externally supplied clock CLK. When the switching element 76 is ON, a signal obtained by delaying the output from the inverter 51 by the inverters 71 and 72 is the internal clock ICLK. That is, the internal clock ICLK is a signal obtained by delaying the clock CLK by the inverters 71 and 72. When the switching element 77 is ON, a signal obtained by delaying the output from the inverter 51 by the inverters 71 to 74 is the internal clock ICLK. That is, the internal clock ICLK is a signal obtained by delaying the clock CLK by the inverters 71 to 74. Accordingly, the delay circuit 70 functions as an internal clock ICLK generator together with a NAND gate 50 and the inverter 51.

Figure 15:
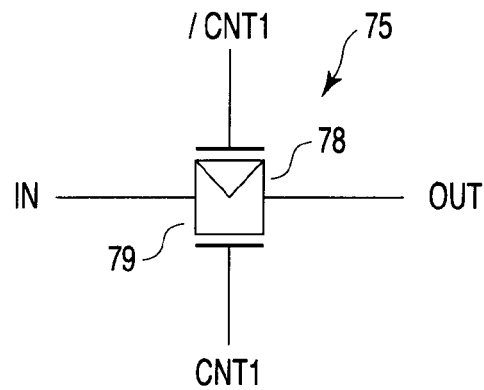
FIG. 15 is a circuit diagram of a switching element included in the data input/output circuit of the EEPROM according to the third embodiment of the present invention.

A practical example of the switching elements 75 to 77 will be explained below with reference to FIG. 15. FIG. 15 is a circuit diagram of the switching element 75. As shown in FIG. 15, the switching element 75 comprises a p-channel MOS transistor 78 and n-channel MOS transistor 79 whose sources and drains are respectively connected to each other. One of the source and drain is an input terminal IN of the switching element 75, and the other one is an output terminal OUT. The gate of the MOS transistor 79 receives the control signal CNT1, and the gate of the MOS transistor 78 receives an inverted signal /CNT1 of the control signal CNT1. The switching elements 76 and 77 have the same arrangement except that the control signals are respectively CNT2 and CNT3, instead of CNT1.

Figure 16:
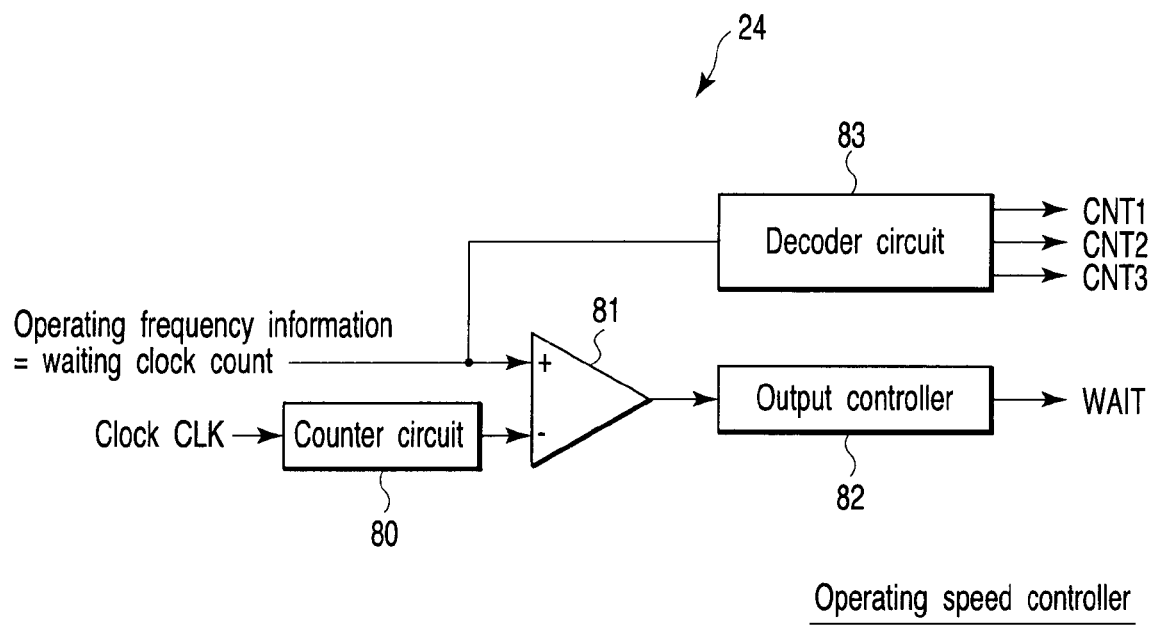
FIG. 16 is a circuit diagram of an operating speed controller of the EEPROM according to the third embodiment of the present invention.

The arrangement of the operating speed controller 24 will be explained below with reference to FIG. 16. FIG. 16 is a circuit diagram of the operating speed controller 24. As shown in FIG. 16, the operating speed controller 24 comprises a counter circuit 80, comparator 81, output controller 82, and decoder circuit 83.

The counter circuit 80 starts counting the clocks CLK simultaneously with the start of a data read operation, in response to an instruction from a controller 23. The comparator 81 compares a waiting clock count supplied as operating frequency information with the count from the counter circuit 80. The waiting clock count will be described later. If the comparison result from the comparator 81 indicates that the count from the counter circuit 80 has reached the waiting clock count, the output controller 82 outputs an output enable signal WAIT to the data input/output circuit 17. The output enable signal WAIT is a signal that enables the data input/output circuit 17 to output data outside. The decoder circuit 83 grasps the frequency of the clock CLK by decoding the waiting clock count, and outputs (asserts) one of the control signals CNT1 to CNT3.

Figures 17, 18:
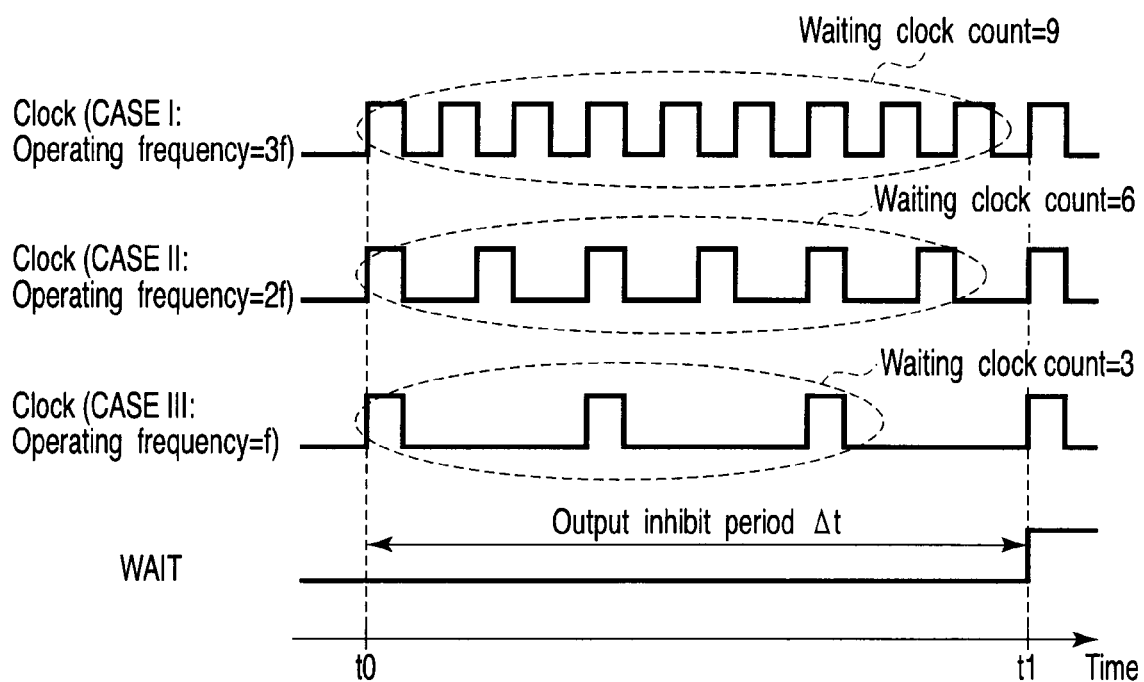
FIG. 17 is a diagram showing the decoding conditions of a decoder circuit included in the operating speed controller of the EEPROM according to the third embodiment of the present invention.
FIG. 18 is a timing chart of clocks and an operation enable signal.

FIG. 17 is a table showing an example of the control signal output condition in the decoder circuit 83. As shown in FIG. 17, if the waiting clock count is 9 or more, the decoder circuit 83 asserts the control signal CNT1. That is, the switching element 75 is turned on. If the waiting clock count is 5 to 8, the decoder circuit 83 asserts the control signal CNT2. That is, the switching element 76 is turned on. If the waiting clock count is 4 or less, the decoder circuit 83 asserts the control signal CNT3. That is, the switching element 77 is turned on. Note that FIG. 17 is merely an example, and the waiting clock counts are not limited to those shown in FIG. 17. Note also that the waiting clock counts are classified into three groups in FIG. 17, but they may also be classified into two groups or four or more groups.

The waiting clock count will be explained below with reference to FIG. 18. FIG. 18 is a timing chart of the clock CLK and output enable signal WAIT, and shows the case (CASE I) that the clock frequency is 3f (f: an arbitrary frequency), the case (CASE II) that the clock frequency is 2f, and the case (CASE III) that the clock frequency is f.

An EEPROM that performs burst access continuously outputs data, so readout data must be stored for a certain predetermined period at the time of initial read. Therefore, the output enable signal WAIT is used to output data when a predetermined period has elapsed since data is read out from a memory cell MC corresponding to the start address. When the output enable signal WAIT is asserted after the elapse of the predetermined period, the data input/output circuit 17 starts outputting the data outside. FIG. 18 indicates this predetermined period as an output inhibit period Δt from time t0 to time t1.

The waiting clock count means the number of clocks corresponding to the output inhibit period Δt. As shown in FIG. 18, assume that the number of clocks (the waiting clock count) corresponding to the output inhibit period Δt is 9 in CASE I in which the operating frequency is 3f. In this case, the waiting clock count is 6 in CASE II in which the operating frequency is 2f, and 3 in CASE III in which the operating frequency is f. That is, the waiting clock count is a signal indicating the clock frequency, and the EEPROM 3 can grasp the operating frequency from the relationship between Δt and the waiting clock count. The user of the LSI 1 inputs the waiting clock count.

Figure 19:
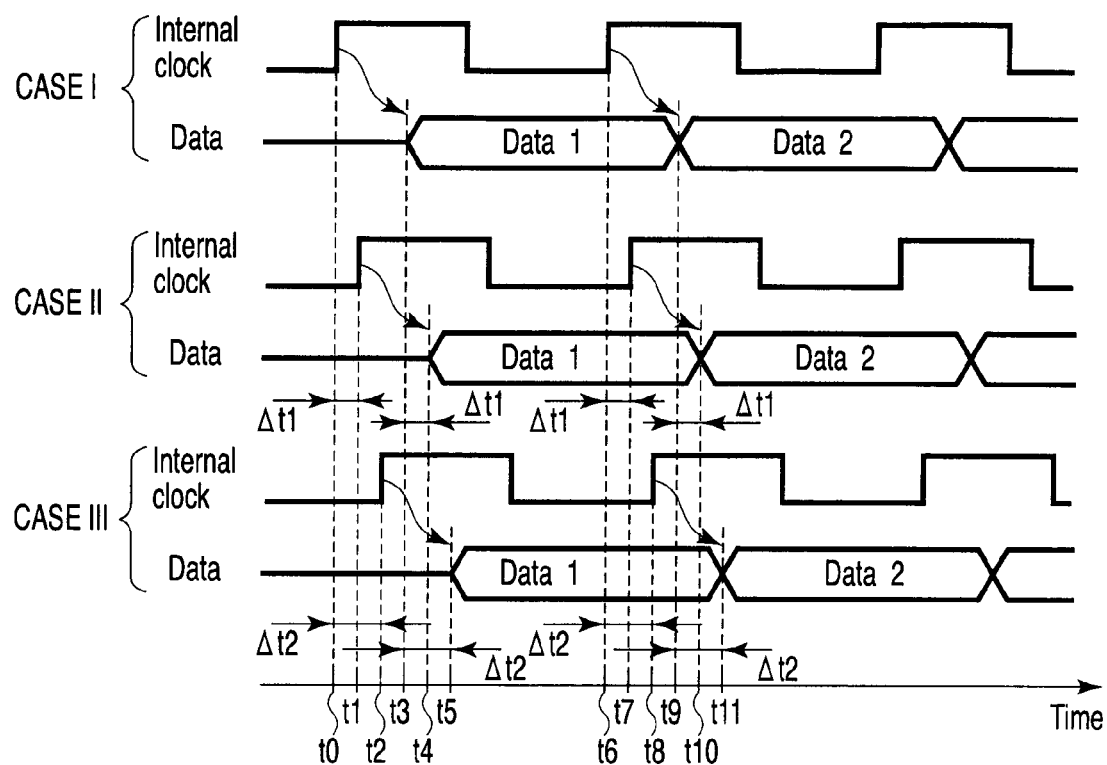
FIG. 19 is a timing chart of the internal clock and output data of the EEPROM according to the third embodiment of the present invention.

The data output timings in the EEPROM 3 with the above arrangement will be explained below with reference to FIG. 19. FIG. 19 is a timing chart of the internal clock ICLK and output data, and shows CASE I, CASE II, and CASE III. For the sake of descriptive simplicity, assume that the internal clock in CASE I has no delay at all from the externally supplied clock CLK.

CASE I will be explained first. The internal clock ICLK rises at time t0, and data 1 is output at time t3 in response to the rise. The internal clock ICLK also rises at time t6, and data 2 is output at time t9 in response to the rise.

CASE II will be explained next. The internal clock ICLK rises at time t1 that delays from time t0 by Δt1, and data 1 is output in response to the rise at time t4 that delays from time t3 by Δt1. The internal clock ICLK also rises at time t7 that delays from time t6 by Δt1, and data 2 is output in response to the rise at time t10 that delays from time t9 by Δt1. The delay time Δt1 corresponds to the delay time in the delay circuits 71 and 72.

CASE III will now be explained. The internal clock ICLK rises at time t2 that delays from time t0 by Δt2, and data 1 is output in response to the rise at time t5 that delays from time t3 by Δt2. The internal clock ICLK also rises at time t8 that delays from time t6 by Δt2, and data 2 is output in response to the rise at time t11 that delays from time t9 by Δt2. The delay time Δt2 corresponds to the delay time in the delay circuits 71 to 74.

As described above, the EEPROM according to the third embodiment of the present invention achieves effect (3) below.

(3) Design of the data output timings can be simplified (No. 3).

Figure 20:
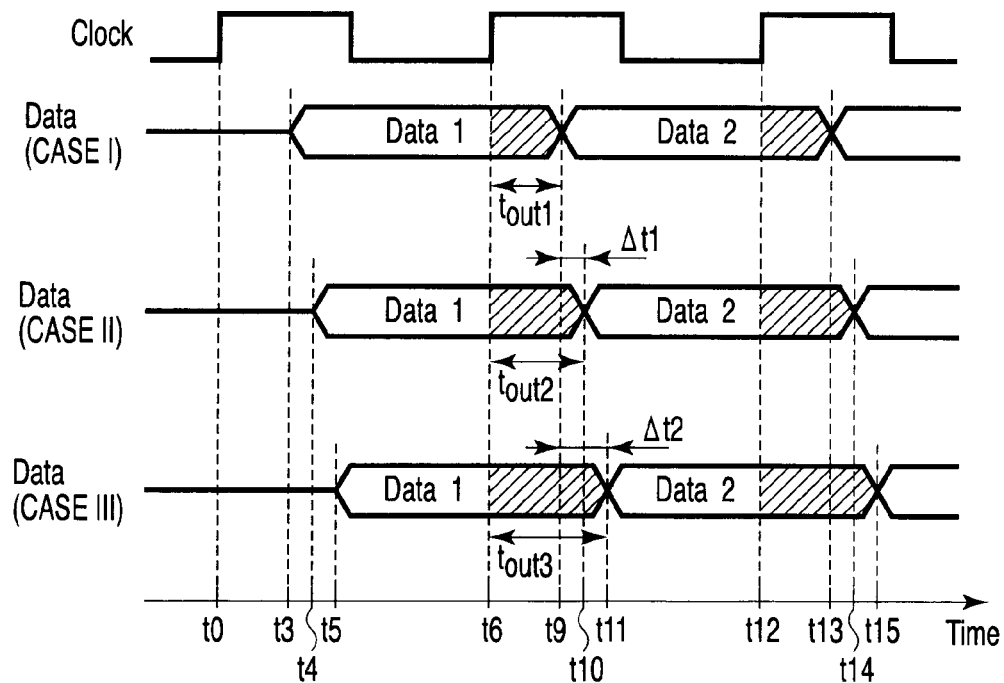
FIG. 20 is a timing chart of the clock and output data of the EEPROM according to the third embodiment of the present invention.

In the arrangement according to this embodiment, the data input/output circuit 17 changes the output timing of data in accordance with the waiting clock count. More specifically, the data input/output circuit 17 delays the data output timing as the frequency of the clock CLK lowers. Accordingly, design of the data output timings can be simplified. This will be explained below with reference to FIG. 20. FIG. 20 is a timing chart of the clock CLK and data, and shows CASE I, CASE II, and CASE III. The data output timings in FIG. 20 are the same as in FIG. 19.

In a semiconductor memory that performs burst access, the period $t_{hold}$ required as the hold time generally shortens as the operating frequency rises, and prolongs as the operating frequency lowers. That is, the hold time changes in accordance with the operating frequency. Therefore, when an EEPROM is designed to satisfy the hold time required for a CPU that operates at, e.g., a high frequency, it is sometimes impossible to satisfy the hold time required for a CPU that operates at a low frequency.

In the arrangement according to this embodiment, however, the data output period can change in accordance with the operating frequency. As shown in FIG. 20, the data output periods in CASE I, CASE II, and CASE III will be called $t_{out1}$, $t_{out2}$, and $t_{out3}$ hereinafter. In this case, the data output period $t_{out2}$ in CASE II in which the operating frequency is lower than that in CASE I is longer than $t_{out1}$ by Δt1. Also, the data output period $t_{out3}$ in CASE III in which the operating frequency is lower than that in CASE II is longer than $t_{out1}$ by Δt2 (>Δt1). That is, the data output period prolongs as the operating frequency (the frequency of the clock CLK) lowers. This is so because the delay time of the delay circuit 70 is changed inversely proportional to the operating frequency (waiting clock count). That is, the data output period is prolonged when a long hold time is necessary, and shortened when the hold time can be short. Even when the operating frequency fluctuates, therefore, it is possible to optimize the data output period, and simplify design of the data output timings. This makes it possible to adapt the EEPROM 3 to various operating frequencies, and improve the versatility of the EEPROM 3.

FOURTH EMBODIMENT

A semiconductor device according to the fourth embodiment of the present invention will be explained below. This embodiment is a combination of the first and third embodiments. FIG. 21 is a block diagram of a system LSI according to this embodiment.

As shown in FIG. 21, an LSI 1 according to this embodiment has an operating speed controller 24 explained in the third embodiment in an EEPROM 3 in the arrangement shown in FIG. 1 explained in the first embodiment. The rest of the configuration is the same as explained in the first and third embodiments.

Figure 22:
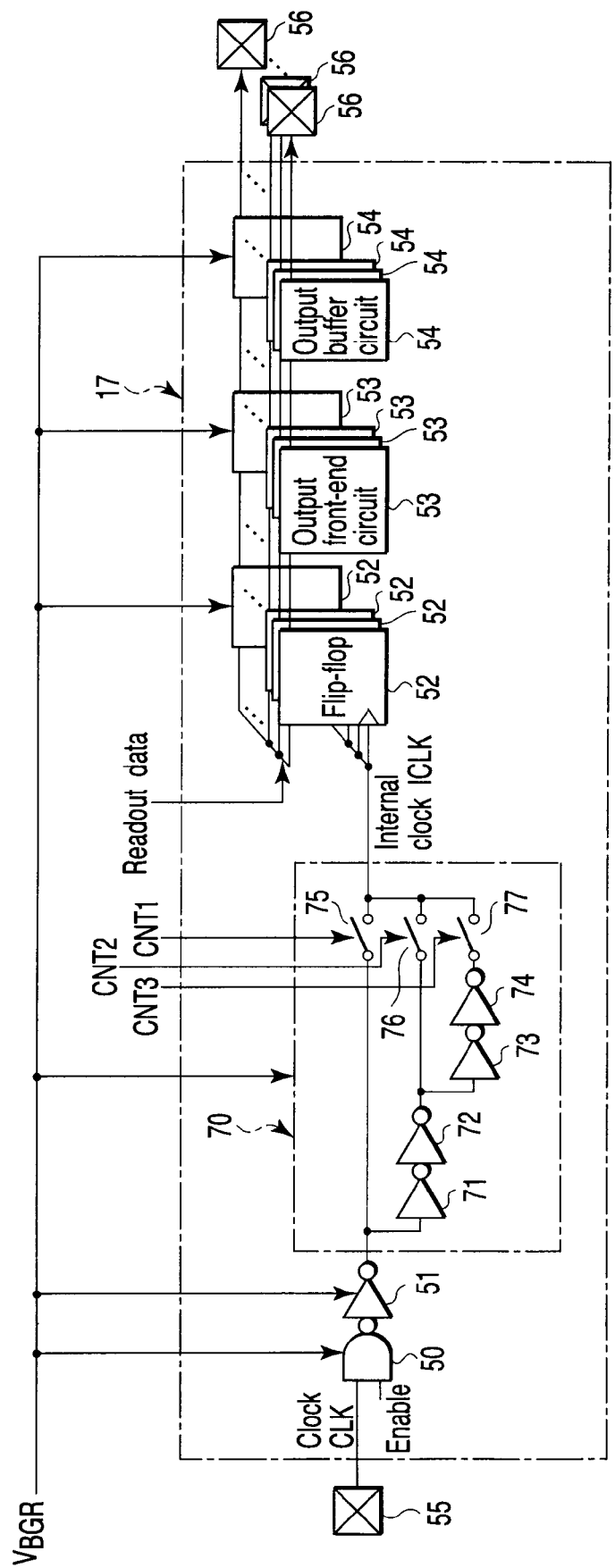
FIG. 22 is a circuit diagram of a data input/output circuit of an EEPROM according to the fourth embodiment of the present invention.

FIG. 22 is a circuit diagram of a data input/output circuit 17 according to this embodiment. As shown in FIG. 22, in the arrangement shown in FIG. 14 explained in the third embodiment, an internal clock ICLK generator including a NAND gate 50, inverter 51, and delay circuit 70, flip-flops 52, output front-end circuits 53, and output buffer circuits 54 operate by using an output voltage $V_{BGR}$ from a power supply circuit (bandgap reference circuit) 22 as a power supply voltage.

The arrangement according to this embodiment can achieve both effect (1) explained in the first embodiment and effect (3) explained in the third embodiment.

Note that in FIG. 22, the voltage $V_{BGR}$ may also be used as the power supply voltage of the delay circuit 70. It is also possible to combine the first and second embodiments. That is, the voltage $V_{BGR}$ may also be given dependence on the temperature in the arrangement according to the fourth embodiment. In this case, effect (2) explained in the second embodiment can also be obtained in addition to effects (1) and (3).

As described above, in the semiconductor devices according to the first, second, and fourth embodiments of the present invention, the bandgap reference circuit generates the power supply voltage of the data input/output circuit that continuously outputs data in synchronism with the clock. This makes the data output rate of the data input/output circuit constant regardless of the external voltage. As a consequence, the data output timings can be easily set. Additionally, the second embodiment gives the dependence on the temperature to the output voltage from the bandgap reference circuit so as to cancel the dependence of the operation characteristics of the semiconductor element on the temperature. Consequently, the data output rate of the data input/output circuit can be made constant regardless of the temperature.

Furthermore, the third and fourth embodiments make the data output period variable in accordance with the operating frequency. Even when the operating frequency fluctuates, therefore, it is possible to set the data output period so as to satisfy the hold time, and improve the versatility of the semiconductor device.

Note that the second embodiment has been explained by taking as an example the case that the voltage $V_{BGR}$ is given the dependence on the temperature so as to cancel the temperature characteristic of the semiconductor element. However, it is not always necessary to completely cancel the temperature characteristic of the semiconductor element. That is, the voltage $V_{BGR}$ need not completely cancel the dependence of the semiconductor element on the temperature, but need only have the dependence on the temperature opposite to that of the semiconductor element. This makes it possible to suppress the dependence of the output rate on the temperature, and obtain the effect of facilitating design of the data output timings. Also, the case that the output rate decreases as the temperature rises has been explained, but the present invention is applicable to the opposite case as well. That is, in an arrangement in which the output rate rises as the temperature rises, $dV_{BGR}/dT$ need only be set to have a negative value. In addition, the above embodiment is also applicable even when the relationship between the data output rate and temperature is not a linear function but a quadratic function. That is, $dV_{BGR}/dT$ need only be determined in accordance with whether the characteristic as a whole is proportional or inversely proportional to the temperature. It is of course also possible to make the temperature characteristic of $V_{BGR}$ be a quadratic function by modifying the arrangement of the bandgap reference circuit 22.

Figure 23:
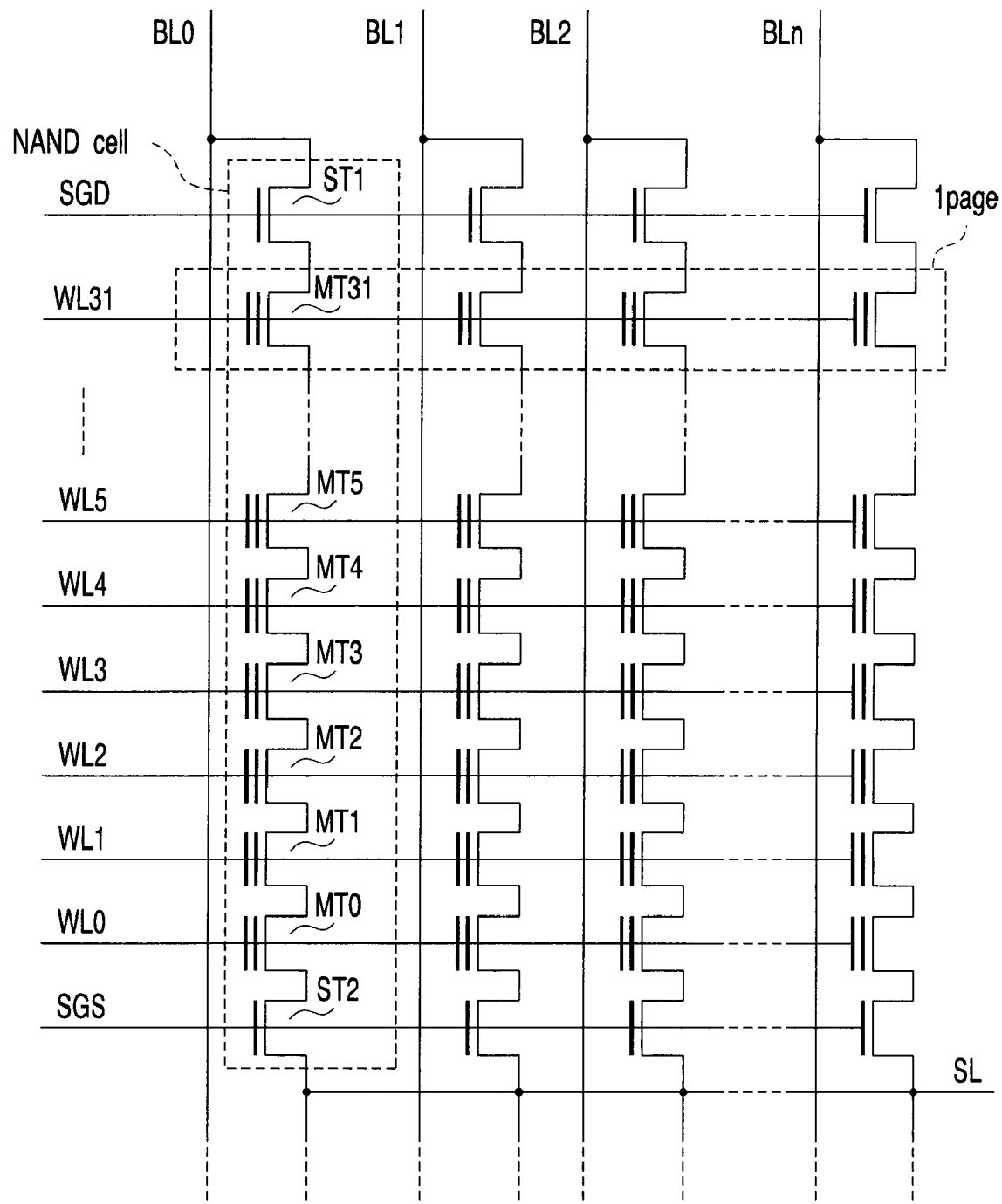
FIG. 23 is a circuit diagram of a memory cell array of an EEPROM according to a modification of the first to fourth embodiments of the present invention.

Also, the above embodiments have been explained by taking the case that the EEPROM 3 is a NOR flash memory as an example. However, the EEPROM 3 need not be a NOR flash memory and may also be a NAND flash memory. FIG. 23 is a circuit diagram of a memory cell array of a NAND flash memory.

As shown in FIG. 23, the memory cell array has a plurality of NAND cells. Although FIG. 23 shows only one line of NAND cells, a plurality of lines of NAND cells may also exist. Each NAND cell includes 32 memory cell transistors MT0 to MT31 and selection transistors ST1 and ST2. For the sake of descriptive simplicity, the memory cell transistors MT0 to MT31 will be simply called memory cell transistors MT hereinafter. The memory cell transistor MT has a stacked gate structure having a floating gate formed on a gate insulating film on a semiconductor substrate, and a control gate electrode formed on an inter-gate insulating film on the floating gate. Note that the number of the memory cell transistors MT is not limited to 32 and may also be 8 or 16, i.e., the number is not particularly limited. Adjacent memory cell transistors MT share the source and drain. The memory cell transistors MT are arranged between the selection transistors ST1 and ST2 such that the current paths are connected in series. The drain region at one end of the series-connected memory cell transistors MT is connected to the source region of the selection transistor ST1, and the source region at the other end is connected to the drain region of the selection transistor ST2.

The control gates of the memory cell transistors MT on the same row are connected together to one of word lines WL0 to WL31. The gates of the selection transistors ST1 on the same row are connected together to a select gate line SGD, and the gates of the selection transistors ST2 on the same row are connected together to a select gate line SGS. Also, the drains of the selection transistors ST1 in the same column of the memory cell array are connected together to one of bit lines BL0 to BLn (n is a natural number). The sources of the selection transistors ST2 are connected together to a source line SL.

The above embodiments can be applied to the NAND flash memory as described above. The above embodiments are also applicable to general semiconductor memories that perform burst access, such as a DRAM and PSRAM (Pseudo SRAM), as well as the flash memories.

Figure 24:
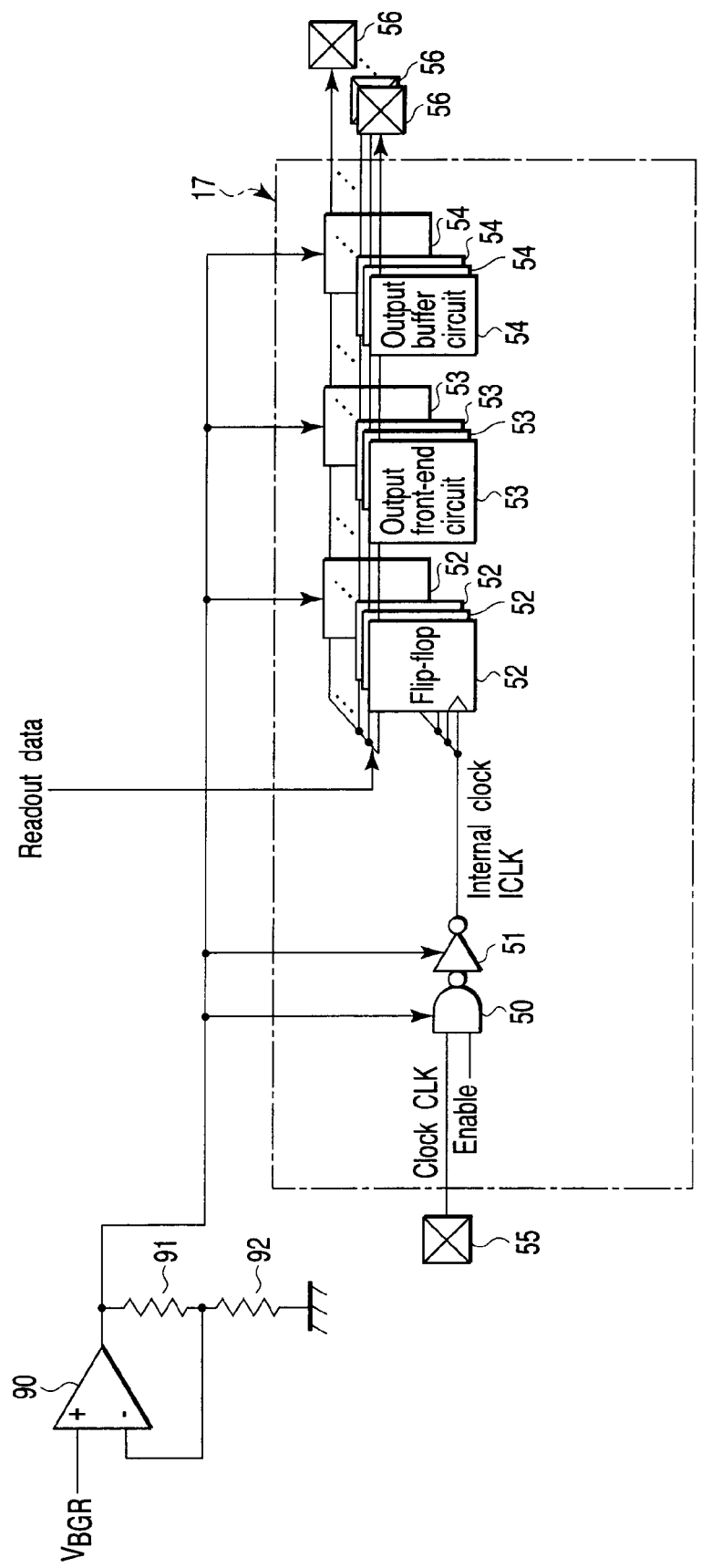
FIG. 24 is a circuit diagram of a power supply circuit and data input/output circuit of an EEPROM according to a modification of the first and second embodiments of the present invention.

Furthermore, the above embodiments have explained the case that the power supply circuit 22 itself is the bandgap reference circuit. However, the power supply circuit 22 may also generate another voltage on the basis of the voltage $V_{BGR}$ generated by the bandgap reference circuit. FIGS. 24 and 25 illustrate arrangements like this. FIGS. 24 and 25 are circuit diagrams each showing a portion of the power supply circuit 22 and the data input/output circuit 17.

As shown in FIGS. 24 and 25, the power supply circuit 22 has a comparator 90 and resistance elements 91 and 92 in addition to the bandgap reference circuit. The resistance element 91 has one terminal connected to the output node of the comparator 90, and the other terminal connected to one terminal of the resistance element 92. The other terminal of the resistance element 92 is grounded. The comparator 90 has a positive input terminal that receives the voltage $V_{BGR}$, and an inverting input terminal connected to the connection node between the other terminal of the resistance element 91 and one terminal of the resistance element 92. In these arrangements, the voltage at the output node of the comparator 90 is supplied as the power supply voltage of the data input/output circuit 17. The voltage at the output node of the comparator 90 is determined by the resistance ratio of the resistance elements 91 and 92 on the basis of the voltage $V_{BGR}$, and has dependence on the temperature equal to that of the voltage $V_{BGR}$.

As described above, the voltage to be supplied as the power supply voltage of the data input/output circuit 17 is not limited to $V_{BGR}$. It is also possible to use, as the power supply voltage of the data input/output circuit 17, a voltage controlled by $V_{BGR}$ and having suppressed dependence on the temperature, or a voltage controlled by $V_{BGR}$ and having dependence on the temperature opposite to that of the data output rate. This is so because the voltage $V_{BGR}$ is about 1.25V; this voltage value is not always optimum as the power supply voltage of the data input/output circuit 17, and it may be necessary to change the voltage value in some cases.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device which continuously outputs data in synchronism with a first clock, comprising:
    a clock generator which generates a second clock from the first clock which is externally supplied;
    a flip-flop circuit which operates in synchronism with the second clock, and receives the data;
    an output buffer circuit which outputs the output data from the flip-flop circuit outside; and
    a power supply circuit which includes a bandgap reference circuit, generates a voltage controlled by the bandgap reference circuit, and supplies the voltage as a power supply voltage to the clock generator, the flip-flop circuit, and the output buffer circuit.

2. The device according to claim 1, wherein the bandgap reference circuit has an output voltage characteristic by which the voltage rises as a temperature rises, and suppresses, by the voltage, dependence of data output rates of the flip-flop circuit and the output buffer circuit on a temperature and an external voltage.

3. The device according to claim 1, wherein the voltage is constant regardless of a temperature change.

4. The device according to claim 1, wherein
    the power supply circuit comprises:
    a transistor having a source connected to a ground terminal and a drain connected to a first node;
    a first resistance element having one terminal connected to the first node and the other terminal connected to a second node;
    a second resistance element having one terminal connected to the first node and the other terminal connected to a third node;
    a third resistance element having one terminal connected to the third node and the other terminal connected to a fourth node;
    a first diode having an anode connected to the second node and a cathode connected to a ground terminal;
    a plurality of second diodes each having an anode connected to the fourth node and a cathode connected to a ground terminal; and
    an operational amplifier having an inverting input terminal connected to the second node, a positive input terminal connected to the third node, and an output terminal connected to a gate of the transistor, and
    the first node outputs the voltage.

5. The device according to claim 4, wherein a resistance ratio of the second resistance element to the first resistance element and a resistance ratio of the second resistance element to the third resistance element control a change in the voltage with a temperature.

6. The device according to claim 1, wherein the clock generator comprises:
    a NAND gate which NANDs the first clock and an enable signal; and
    an inverter which outputs the second clock by inverting an operation result from the NAND gate.

7. The device according to claim 1, wherein
    the power supply circuit further comprises:
    a first resistance element having one terminal connected to a node and having the other terminal;
    a second resistance element having one terminal connected to the node and the other terminal connected to a ground terminal; and
    a comparator having a positive input terminal which receives the voltage generated by the bandgap reference circuit, an inverting input terminal connected to the node, and an output terminal connected to the other terminal of the first resistance element, and
    a voltage at the output terminal of the comparator, which is based on the voltage generated by the bandgap reference circuit, is used as the power supply voltage of the clock generator, the flip-flop circuit, and the output buffer circuit.

8. The device according to claim 1, wherein the semiconductor device is an EEPROM.

9. The device according to claim 1, further comprising a memory cell array in which a plurality of memory cells each comprising a charge storage layer and a control gate formed on the charge storage layer are arranged in a matrix.

10. A semiconductor device which continuously outputs data in synchronism with a clock, comprising:
    a clock generator including a delay circuit which delays the clock;
    a flip-flop circuit which operates in synchronism with the clock delayed by the delay circuit, and receives the data; and
    an output buffer circuit which outputs the output data from the flip-flop circuit outside,
    wherein a delay time of the delay circuit changes inversely proportional to a frequency of the clock.

11. The device according to claim 10, which further comprises a decoder circuit which grasps the frequency of the clock by decoding externally input operating frequency information, and in which the delay circuit comprises a plurality of clock delay units which receive the clock and are different in delay time, and the decoder circuit makes one of the clock delay units operable in accordance with the operating frequency information, and makes one of the clock delay units which has a long delay time operable as the frequency of the clock rises.

12. The device according to claim 10, wherein the bandgap reference circuit has an output voltage characteristic by which the voltage rises as a temperature rises, and suppresses, by the voltage, dependence of data output rates of the flip-flop circuit and the output buffer circuit on a temperature and an external voltage.

13. The device according to claim 10, further comprising a voltage generator which generates a power supply voltage of the clock generator, the flip-flop circuit, and the output buffer circuit.

14. The device according to claim 10, further comprising a power supply circuit which includes a bandgap reference circuit, generates a voltage controlled by the bandgap reference circuit, and supplies the voltage as a power supply voltage to the clock generator, the flip-flop circuit, and the output buffer circuit.

15. The device according to claim 14, wherein the voltage is constant regardless of a temperature change.

16. The device according to claim 14, wherein
the power supply circuit comprises:
a transistor having a source connected to a ground terminal and a drain connected to a first node;
a first resistance element having one terminal connected to the first node and the other terminal connected to a second node;
a second resistance element having one terminal connected to the first node and the other terminal connected to a third node;
a third resistance element having one terminal connected to the third node and the other terminal connected to a fourth node;
a first diode having an anode connected to the second node and a cathode connected to a ground terminal;
a plurality of second diodes each having an anode connected to the fourth node and a cathode connected to a ground terminal; and
an operational amplifier having an inverting input terminal connected to the second node, a positive input terminal connected to the third node, and an output terminal connected to a gate of the transistor, and
the first node outputs the voltage.

17. The device according to claim 16, wherein a resistance ratio of the second resistance element to the first resistance element and a resistance ratio of the second resistance element to the third resistance element control a change in the voltage with a temperature.

18. The device according to claim 14, wherein
the power supply circuit further comprises:
a first resistance element having one terminal connected to a node and having the other terminal;
a second resistance element having one terminal connected to the node and the other terminal connected to a ground terminal; and
a comparator having a positive input terminal which receives the voltage generated by the bandgap reference circuit, an inverting input terminal connected to the node, and an output terminal connected to the other terminal of the first resistance element, and
a voltage at the output terminal of the comparator, which is based on the voltage generated by the bandgap reference circuit, is used as the power supply voltage of the clock generator, the flip-flop circuit, and the output buffer circuit.

19. The device according to claim 10, wherein the semiconductor device is an EEPROM.

20. The device according to claim 10, further comprising a memory cell array in which a plurality of memory cells each comprising a charge storage layer and a control gate formed on the charge storage layer are arranged in a matrix.

* * * * *